United States Patent
Naamad et al.

(10) Patent No.: US 11,853,656 B1
(45) Date of Patent: Dec. 26, 2023

(54) DATA STORAGE SYSTEM MODELING USING APPLICATION SERVICE LEVEL OBJECTIVES AND SPECIFIED WORKLOAD LIMITS FOR STORAGE TIERS

(71) Applicant: EMC IP Holding Company LLC, Hopkinton, MA (US)

(72) Inventors: Amnon Naamad, Brookline, MA (US); Hui Wang, Upton, MA (US); Ron Arnan, Nes-Ziona (IL)

(73) Assignee: EMC IP Holding Company LLC, Hopkinton, MA (US)

( * ) Notice: Subject to any disclaimer, the term of this patent is extended or adjusted under 35 U.S.C. 154(b) by 1006 days.

(21) Appl. No.: 14/870,595

(22) Filed: Sep. 30, 2015

(51) Int. Cl.
*G06F 30/20* (2020.01)

(52) U.S. Cl.
CPC ................... *G06F 30/20* (2020.01)

(58) Field of Classification Search
None
See application file for complete search history.

(56) References Cited

U.S. PATENT DOCUMENTS

| | | | |
|---|---|---|---|
| 7,281,105 B1 * | 10/2007 | Wang | G06F 11/3447 711/165 |
| 7,356,452 B1 * | 4/2008 | Naamad | G06F 11/3433 703/21 |
| 7,363,453 B1 * | 4/2008 | Arnan | G06F 3/061 707/999.002 |
| 7,640,342 B1 * | 12/2009 | Aharoni | G06F 3/0605 370/237 |
| 7,949,637 B1 | 5/2011 | Burke | |
| 8,380,928 B1 * | 2/2013 | Chen | G06F 3/0649 711/117 |
| 8,433,848 B1 * | 4/2013 | Naamad | G06F 3/0605 711/114 |
| 8,621,178 B1 * | 12/2013 | Lazar | G06F 12/0223 711/117 |
| 8,700,806 B1 * | 4/2014 | Slik | H04L 41/0813 709/220 |

(Continued)

OTHER PUBLICATIONS

Tai, Jianzhe. "Resource management in enterprise cluster and storage systems." Northeastern University. (2015). 85 pages (Year: 2015).*

(Continued)

*Primary Examiner* — Bijan Mapar
(74) *Attorney, Agent, or Firm* — Muirhead and Saturnelli, LLC

(57) ABSTRACT

Described are techniques for modeling processing performed in a data storage system. Inputs received may include a plurality of workloads each denoting a workload for one of a plurality of storage groups, a plurality of service level objectives each denoting a target level of performance for one of the plurality of storage groups, a plurality of capacities each denoting a storage capacity of one of a plurality of storage tiers, and a plurality of maximum workloads each denoting a maximum workload capability of one of the plurality of storage tiers. Using the inputs, placement of data of the plurality of storage groups on the plurality of storage tiers may be modeled. Output(s) may be generated based on the modeling where the output(s) may include an amount of each of the plurality of storage tiers allocated by modeling to each of the plurality of storage groups.

22 Claims, 19 Drawing Sheets

(56) References Cited

U.S. PATENT DOCUMENTS

| | | | | |
|---|---|---|---|---|
| 8,838,887 B1* | 9/2014 | Burke | G06F 3/0689 |
| | | | 711/112 |
| 8,838,931 B1* | 9/2014 | Marshak | G06F 3/0649 |
| | | | 711/170 |
| 8,949,483 B1* | 2/2015 | Martin | G06F 3/0653 |
| | | | 710/15 |
| 9,152,349 B2 | 10/2015 | Yochai | |
| 9,665,288 B1* | 5/2017 | Aharoni | G06F 3/0649 |
| 9,983,795 B1* | 5/2018 | Naamad | G06F 3/0629 |
| 2009/0070541 A1 | 3/2009 | Yochai | |
| 2010/0262633 A1* | 10/2010 | Bhattacharjee | G06F 16/245 |
| | | | 707/812 |
| 2012/0317358 A1* | 12/2012 | Ando | G06F 3/0605 |
| | | | 711/117 |
| 2013/0073702 A1* | 3/2013 | Umbehocker | G06F 3/067 |
| | | | 709/222 |
| 2016/0048355 A1* | 2/2016 | Iliadis | G06F 3/0649 |
| | | | 711/171 |
| 2016/0231928 A1* | 8/2016 | Lewis | G06F 3/0631 |
| 2016/0378654 A1* | 12/2016 | Chambliss | G06F 3/0649 |
| | | | 711/122 |
| 2018/0203614 A1* | 7/2018 | Aronovich | G06F 3/0659 |
| 2018/0314427 A1* | 11/2018 | Dalmatov | G06F 3/0644 |
| 2019/0073275 A1* | 3/2019 | Sarafijanovic | G06F 3/0649 |
| 2019/0317670 A1* | 10/2019 | Weiss | G06F 3/0604 |
| 2019/0384521 A1* | 12/2019 | Patel | G06F 3/0653 |
| 2021/0120084 A1* | 4/2021 | Gorantla | G06F 3/067 |
| 2021/0200458 A1* | 7/2021 | Dalmatov | G06F 3/0683 |
| 2022/0091738 A1* | 3/2022 | Patil | G06F 3/0647 |

OTHER PUBLICATIONS

Arumugam, Rajesh Vellore. "Performance enhancements in large scale storage systems." PhD diss., 2015. 201 pages (Year: 2015).*

Cheng, Yue, M. Safdar Iqbal, Aayush Gupta, and Ali R. Butt. "Cast: Tiering storage for data analytics in the cloud." In Proceedings of the 24th International Symposium on High-Performance Parallel and Distributed Computing, pp. 45-56. 2015 (Year: 2015).*

U.S. Appl. No. 14/751,861, filed Jun. 26, 2015, Wang.

* cited by examiner

DATA STORAGE SYSTEM MODELING USING APPLICATION SERVICE LEVEL OBJECTIVES AND SPECIFIED WORKLOAD LIMITS FOR STORAGE TIERS

BACKGROUND

Technical Field

This application generally relates to data storage systems.

Description of Related Art

Computer systems may include different resources used by one or more host processors. Resources and host processors in a computer system may be interconnected by one or more communication connections. These resources may include, for example, data storage devices such as those included in the data storage systems manufactured by EMC Corporation. These data storage systems may be coupled to one or more host processors and provide storage services to each host processor. Multiple data storage systems from one or more different vendors may be connected and may provide common data storage for one or more host processors in a computer system.

A host processor may perform a variety of data processing tasks and operations using the data storage system. For example, a host processor may perform I/O operations in connection with data requests, such as data read and write operations.

Host processor systems may store and retrieve data using a storage device containing a plurality of host interface units, disk drives, and disk interface units. Such storage devices are provided, for example, by EMC Corporation of Hopkinton, Mass. The host systems access the storage device through a plurality of channels provided therewith. Host systems provide data and access control information through the channels to the storage device and storage device provides data to the host systems also through the channels. The host systems do not address the disk drives of the storage device directly, but rather, access what appears to the host systems as a plurality of logical disk units, logical devices, or logical volumes. The logical disk units may or may not correspond to the actual disk drives. Allowing multiple host systems to access the single storage device unit allows the host systems to share data stored therein.

In connection with data storage, a variety of different technologies may be used. Data may be stored, for example, on different types of disk devices and/or flash memory devices. The data storage environment may define multiple storage tiers in which each tier includes physical devices or drives of varying technologies. The physical devices of a data storage system, such as a data storage array, may be used to store data for multiple applications.

SUMMARY OF THE INVENTION

In accordance with one aspect of the invention is a method of modeling processing performed in a data storage system comprising: receiving inputs including a plurality of workloads each denoting a workload for a different one of a plurality of storage groups, a plurality of service level objectives each denoting a target level of performance for a different one of the plurality of storage groups, a plurality of capacities each denoting a storage capacity of a different one of a plurality of storage tiers, and a plurality of maximum workloads each denoting a maximum workload capability of a different one of the plurality of storage tiers; modeling, using the inputs, placement of data of the plurality of storage groups on the plurality of storage tiers; and generating one or more outputs based on the modeling, the one or more outputs including an amount of each of the plurality of storage tiers allocated by said modeling to each of the plurality of storage groups. Modeling may include modeling placement of data of the plurality of storage groups in accordance with criteria including maintaining minimum workloads for the plurality of storage tiers and may include attempting to meet the plurality of service level objectives for the plurality of storage tiers. Modeling may include evaluating a plurality of modeled alternatives each using a different value for a minimum workload for a lowest performing one of the plurality of storage tiers. The plurality of storage tiers may include at least two storage tiers, each of the at least two storage tiers including physical storage devices having a set of performance characteristics that differs from performance characteristics of other physical storage devices of other ones of the at least two storage tiers. For a first of the plurality of storage tiers, a first minimum workload may be specified denoting a minimum workload to be placed on the first storage tier, and modeling may include includes modeling placement of first data in the first storage tier until any of: there is no remaining capacity in the first storage tier, and modeled workload for data placed in the first tier reaches the first minimum workload. The first tier may be a highest performing one of the plurality of tiers and the first data may be those data portions of the plurality of storage groups having a highest workload of all data portions of the plurality of storage groups. The first storage tier may have remaining capacity, and modeling may include modeling placement of one or more additional data portions on the first tier while maintaining one or more constraints including a modeled workload for data placed on the storage tier being at least the first minimum workload and also not exceeding a first of the plurality of maximum workloads associated with the first storage tier. The one or more additional data portions may be selected for modeled placement in the first storage tier from one or more of the plurality of storage groups each not meeting a corresponding one of the plurality of service level objectives for said each storage group. Modeling may include modeling a swap of a first data portion, currently placed by modeling on the first storage tier, with a second data portion, currently placed by modeling on a second of the plurality of storage tiers ranked lower in terms of performance than the first storage tier. The first data portion may be included in a first of the plurality of storage groups meeting its associated one of the plurality of service level objectives and wherein the second data portion may be included in a second of the plurality of storage groups not meeting its associated one of the plurality of service level objectives. Modeling may also include determining whether swapping the first data portion with the second data portion would result in the first storage group no longer meeting its associated one of the plurality of service level objectives; and determining not to model a swap of the first data portion and the second data portion if it is determined that swapping the first data portion with the second data portion would result in the first storage group no longer meeting its associated one of the plurality of service level objectives. Modeling may also include determining a first modeled workload for the first storage tier denoting a modeled workload of the first storage tier if the first and second data portions are swapped; determining whether the first modeled workload exceeds the first of the plurality of maximum workloads associated with the first storage tier;

and determining not to model a swap of the first data portion and the second data portion if it is determined that swapping the first data portion with the second data portion would result in the first modeled workload exceeding the first of the plurality of maximum workloads associated with the first storage tier. The method may include modeling placement of data from the plurality of storage groups into a second of the plurality of storage tiers after modeling placement of data in the first storage tier. Each of the plurality of workloads may denote a backend I/O workload for one of the plurality of storage groups, and each of the plurality of service level objectives may denote a response time. Each of the plurality of storage groups may include one or more logical devices using by an application and wherein at least one of the logical devices in at least one of the plurality of storage groups may be a virtually provisioned logical device. The one or more outputs may include a metric for each of the plurality of storage groups denoting a modeled performance for said each storage group based on an amount of each of the plurality of storage tiers allocated by said modeling to said each storage group.

In accordance with another aspect of the invention is a system comprising: a processor; and a memory comprising code stored thereon that, when executed, performs a method of modeling processing performed in a data storage system comprising: receiving inputs including a plurality of workloads each denoting a workload for a different one of a plurality of storage groups, a plurality of service level objectives each denoting a target level of performance for a different one of the plurality of storage groups, a plurality of capacities each denoting a storage capacity of a different one of a plurality of storage tiers, and a plurality of maximum workloads each denoting a maximum workload capability of a different one of the plurality of storage tiers; modeling, using the inputs, placement of data of the plurality of storage groups on the plurality of storage tiers; and generating one or more outputs based on the modeling, the one or more outputs including an amount of each of the plurality of storage tiers allocated by said modeling to each of the plurality of storage groups.

In accordance with another aspect of the invention is a computer readable medium comprising code stored thereon that, when executed, performs a method of modeling processing performed in a data storage system comprising: receiving inputs including a plurality of workloads each denoting a workload for a different one of a plurality of storage groups, a plurality of service level objectives each denoting a target level of performance for a different one of the plurality of storage groups, a plurality of capacities each denoting a storage capacity of a different one of a plurality of storage tiers, and a plurality of maximum workloads each denoting a maximum workload capability of a different one of the plurality of storage tiers; modeling, using the inputs, placement of data of the plurality of storage groups on the plurality of storage tiers; and generating one or more outputs based on the modeling, the one or more outputs including an amount of each of the plurality of storage tiers allocated by said modeling to each of the plurality of storage groups.

BRIEF DESCRIPTION OF THE DRAWINGS

Features and advantages of the present invention will become more apparent from the following detailed description of exemplary embodiments thereof taken in conjunction with the accompanying drawings in which.

DETAILED DESCRIPTION OF EMBODIMENT(S)

Figure 1:
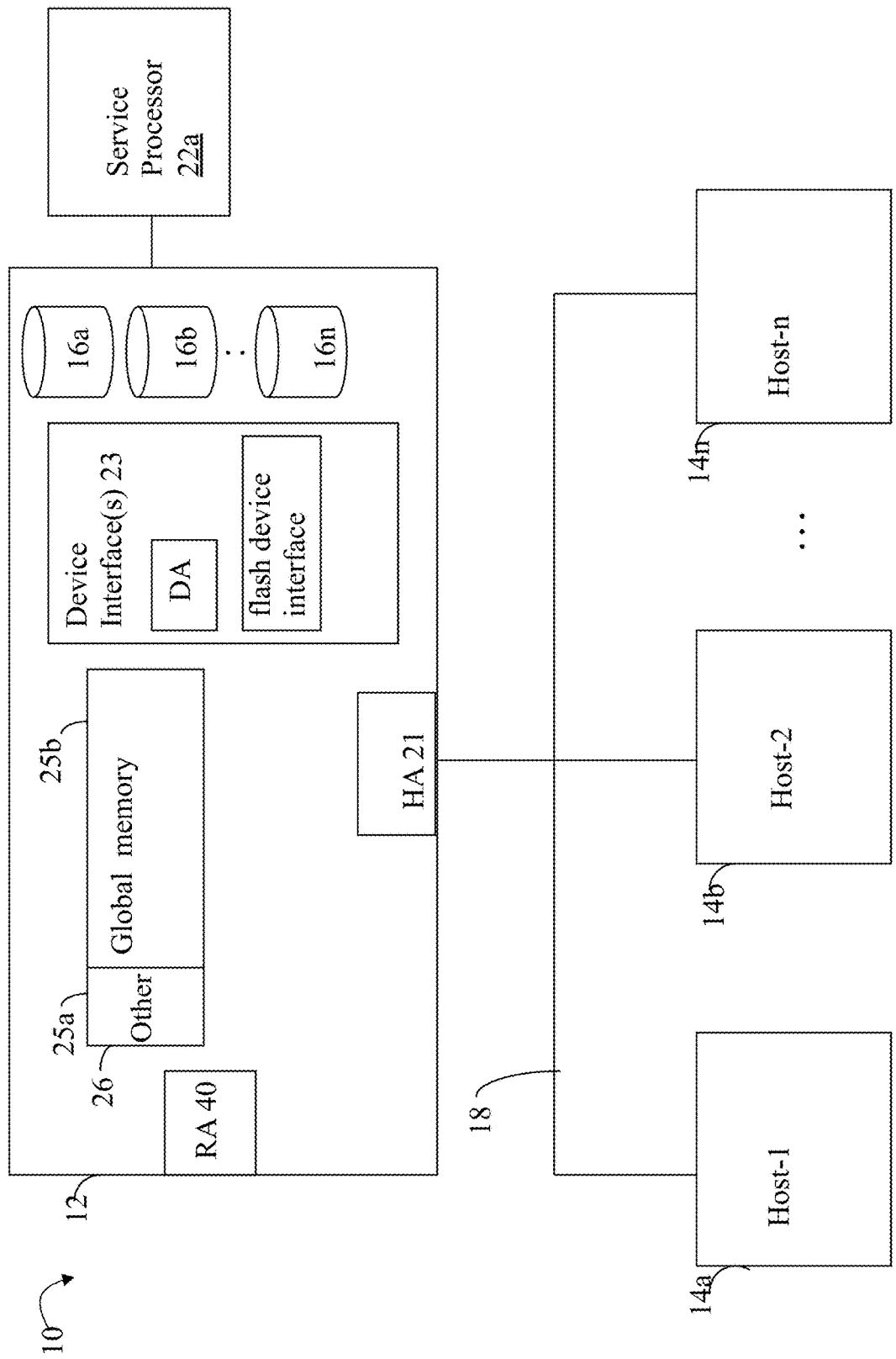
FIG. 1 is an example of an embodiment of a system that may utilize the techniques described herein.

Referring to FIG. 1, shown is an example of an embodiment of a system that may be used in connection with performing the techniques described herein. The system 10 includes a data storage system 12 connected to host systems 14a-14n through communication medium 18. In this embodiment of the computer system 10, and the n hosts 14a-14n may access the data storage system 12, for example, in performing input/output (I/O) operations or data requests. The communication medium 18 may be any one or more of a variety of networks or other type of communication connections as known to those skilled in the art. The communication medium 18 may be a network connection, bus, and/or other type of data link, such as a hardwire or other connections known in the art. For example, the communication medium 18 may be the Internet, an intranet, network (including a Storage Area Network (SAN)) or other wireless or other hardwired connection(s) by which the host systems 14a-14n may access and communicate with the data storage system 12, and may also communicate with other components included in the system 10.

Each of the host systems 14a-14n and the data storage system 12 included in the system may be connected to the communication medium 18 by any one of a variety of connections as may be provided and supported in accordance with the type of communication medium 18. The processors included in the host computer systems 14a-14n may be any one of a variety of proprietary or commercially available single or multi-processor system, such as an Intel-based processor, or other type of commercially available processor able to support traffic in accordance with each particular embodiment and application.

It should be noted that the particular examples of the hardware and software that may be included in the data storage system 12 are described herein in more detail, and may vary with each particular embodiment. Each of the host computers 14a-14n and data storage system may all be located at the same physical site, or, alternatively, may also be located in different physical locations. Examples of the communication medium that may be used to provide the different types of connections between the host computer systems and the data storage system of the system 10 may use a variety of different communication protocols such as SCSI, Fibre Channel, iSCSI, and the like. Some or all of the connections by which the hosts and data storage system may be connected to the communication medium may pass through other communication devices, such switching equipment that may exist such as a phone line, a repeater, a multiplexer or even a satellite.

Each of the host computer systems may perform different types of data operations in accordance with different types of tasks. In the embodiment of FIG. 1, any one of the host computers 14a-14n may issue a data request to the data storage system 12 to perform a data operation. For example, an application executing on one of the host computers 14a-14n may perform a read or write operation resulting in one or more data requests to the data storage system 12.

It should be noted that although element 12 is illustrated as a single data storage system, such as a single data storage array, element 12 may also represent, for example, multiple data storage arrays alone, or in combination with, other data storage devices, systems, appliances, and/or components having suitable connectivity, such as in a SAN, in an embodiment using the techniques herein. It should also be noted that an embodiment may include data storage arrays or other components from one or more vendors. In subsequent examples illustrated the techniques herein, reference may be made to a single data storage array by a vendor, such as by EMC Corporation of Hopkinton, Massachusetts. However, as will be appreciated by those skilled in the art, the techniques herein are applicable for use with other data storage arrays by other vendors and with other components than as described herein for purposes of example.

The data storage system 12 may be a data storage array including a plurality of data storage devices 16a-16n. The data storage devices 16a-16n may include one or more types of data storage devices such as, for example, one or more disk drives and/or one or more solid state drives (SSDs). An SSD is a data storage device that uses solid-state memory to store persistent data. An SSD using SRAM or DRAM, rather than flash memory, may also be referred to as a RAM drive. SSD may refer to solid state electronics devices as distinguished from electromechanical devices, such as hard drives, having moving parts. Flash devices or flash memory-based SSDs are one type of SSD that contains no moving parts. As described in more detail in following paragraphs, the techniques herein may be used in an embodiment in which one or more of the devices 16a-16n are flash drives or devices. More generally, the techniques herein may also be used with any type of SSD although following paragraphs may make reference to a particular type such as a flash device or flash memory device.

The data storage array may also include different types of adapters or directors, such as an HA 21 (host adapter), RA 40 (remote adapter), and/or device interface 23. Each of the adapters may be implemented using hardware including a processor with local memory with code stored thereon for execution in connection with performing different operations. The HAs may be used to manage communications and data operations between one or more host systems and the global memory (GM). In an embodiment, the HA may be a Fibre Channel Adapter (FA) or other adapter which facilitates host communication. The HA 21 may be characterized as a front end component of the data storage system which receives a request from the host. The data storage array may include one or more RAs that may be used, for example, to facilitate communications between data storage arrays. The data storage array may also include one or more device interfaces 23 for facilitating data transfers to/from the data storage devices 16a-16n. The data storage interfaces 23 may include device interface modules, for example, one or more disk adapters (DAs) (e.g., disk controllers), adapters used to interface with the flash drives, and the like. The DAs may also be characterized as back end components of the data storage system which interface with the physical data storage devices.

One or more internal logical communication paths may exist between the device interfaces 23, the RAs 40, the HAs 21, and the memory 26. An embodiment, for example, may use one or more internal busses and/or communication modules. For example, the global memory portion 25b may be used to facilitate data transfers and other communications between the device interfaces, HAs and/or RAs in a data storage array. In one embodiment, the device interfaces 23 may perform data operations using a cache that may be included in the global memory 25b, for example, when communicating with other device interfaces and other components of the data storage array. The other portion 25a is that portion of memory that may be used in connection with other designations that may vary in accordance with each embodiment.

The particular data storage system as described in this embodiment, or a particular device thereof, such as a disk or particular aspects of a flash device, should not be construed as a limitation. Other types of commercially available data storage systems, as well as processors and hardware controlling access to these particular devices, may also be included in an embodiment.

Host systems provide data and access control information through channels to the storage systems, and the storage systems may also provide data to the host systems also through the channels. The host systems do not address the drives or devices 16a-16n of the storage systems directly, but rather access to data may be provided to one or more host systems from what the host systems view as a plurality of logical devices or logical volumes (LVs) which may also be referred to as logical units (e.g., LUNs). The LUNs may or may not correspond to the actual physical devices or drives 16a-16n. For example, one or more LUNs may reside on a single physical drive or multiple drives. Data in a single data storage system, such as a single data storage array, may be accessed by multiple hosts allowing the hosts to share the data residing therein. The HAs may be used in connection with communications between a data storage array and a host system. The RAs may be used in facilitating communications between two data storage arrays. The DAs may be one type of device interface used in connection with facilitating data transfers to/from the associated disk drive(s) and LUN(s) residing thereon. A flash device interface may be another type of device interface used in connection with facilitating data transfers to/from the associated flash devices and LUN(s) residing thereon. It should be noted that an embodiment may use the same or a different device interface for one or more different types of devices than as described herein.

The device interface, such as a DA, performs I/O operations on a drive 16a-16n. In the following description, data residing on an LUN may be accessed by the device interface following a data request in connection with I/O operations that other directors originate. Data may be accessed by LUN in which a single device interface manages data requests in connection with the different one or more LUNs that may reside on a drive 16a-16n.

Also shown in FIG. 1 is a service processor 22a that may be used to manage and monitor the system 12. In one embodiment, the service processor 22a may be used in collecting performance data, for example, regarding the I/O performance in connection with data storage system 12. This performance data may relate to, for example, performance measurements in connection with a data request as may be made from the different host computer systems 14a 14n. This performance data may be gathered and stored in a storage area.

It should be noted that a service processor 22a may exist external to the data storage system 12 and may communicate with the data storage system 12 using any one of a variety of communication connections. In one embodiment, the service processor 22a may communicate with the data storage system 12 through three different connections, a serial port, a parallel port and using a network interface card, for example, with an Ethernet connection. Using the Ethernet connection, for example, a service processor may communicate directly with DAs and HAs within the data storage system 12.

Figure 2:
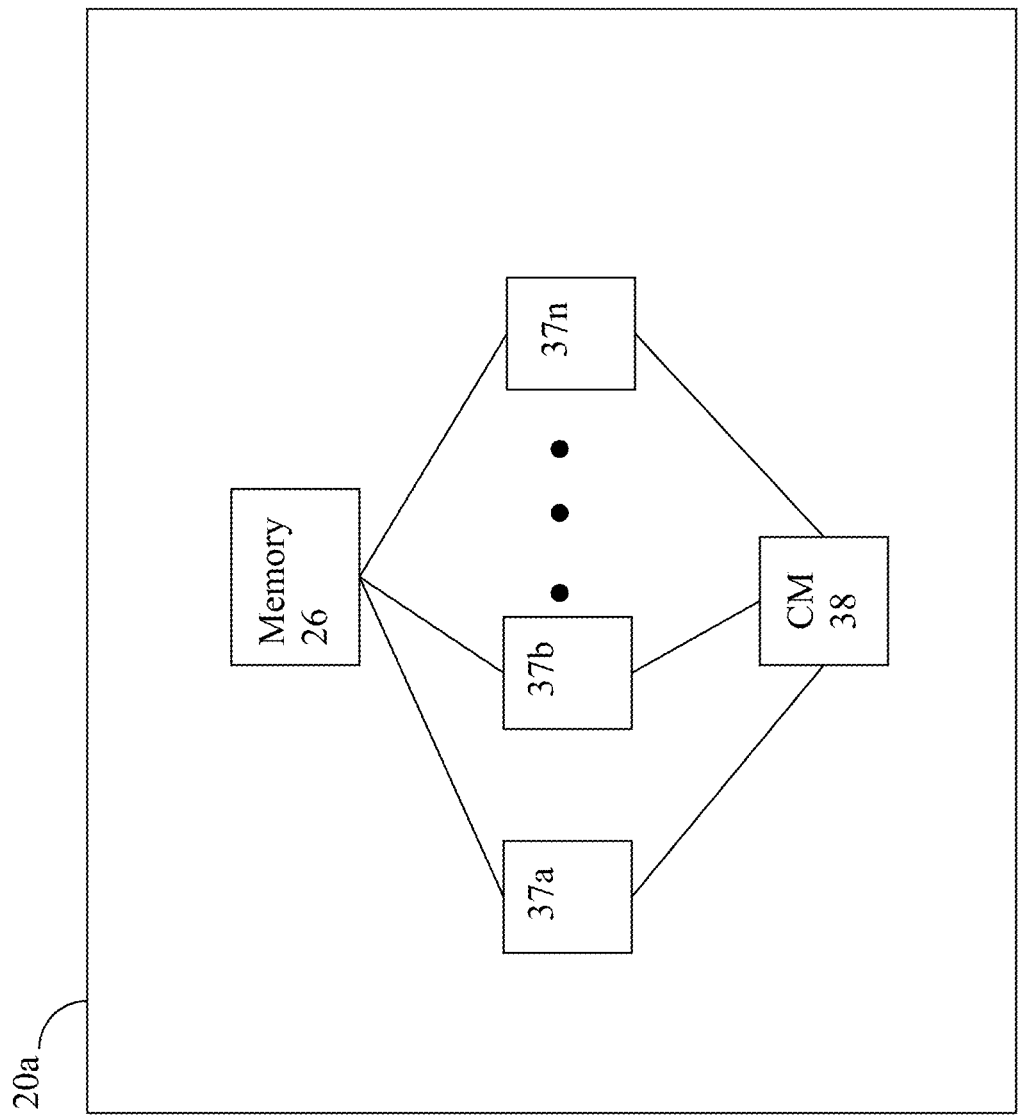
FIG. 2 is a representation of the logical internal communications between the directors and memory included in one embodiment of a data storage system of FIG. 1.

Referring to FIG. 2, shown is a representation of the logical internal communications between the directors and memory included in a data storage system. Included in FIG. 2 is a plurality of directors 37a-37n coupled to the memory 26. Each of the directors 37a-37n represents one of the HAs, RAs, or device interfaces that may be included in a data storage system. In an embodiment disclosed herein, there may be up to sixteen directors coupled to the memory 26. Other embodiments may allow a maximum number of directors other than sixteen as just described and the maximum number may vary with embodiment.

The representation of FIG. 2 also includes an optional communication module (CM) 38 that provides an alternative communication path between the directors 37a-37n. Each of the directors 37a-37n may be coupled to the CM 38 so that any one of the directors 37a-37n may send a message and/or data to any other one of the directors 37a-37n without needing to go through the memory 26. The CM 38 may be implemented using conventional MUX/router technology where a sending one of the directors 37a-37n provides an appropriate address to cause a message and/or data to be received by an intended receiving one of the directors 37a-37n. In addition, a sending one of the directors 37a-37n may be able to broadcast a message to all of the other directors 37a-37n at the same time.

With reference back to FIG. 1, components of the data storage system may communicate using GM 25b. For example, in connection with a write operation, an embodiment may first store the data in cache included in a portion of GM 25b, mark the cache slot including the write operation data as write pending (WP), and then later destage the WP data from cache to one of the devices 16a-16n. In connection with returning data to a host from one of the devices as part of a read operation, the data may be copied from the device by the appropriate device interface, such as a DA servicing the device. The device interface may copy the data read into a cache slot included in GM which is, in turn, communicated to the appropriate HA in communication with the host.

In an embodiment in accordance with techniques herein, the data storage system as described may be characterized as having one or more logical mapping layers in which a logical device of the data storage system is exposed to the host whereby the logical device is mapped by such mapping layers of the data storage system to one or more physical devices. Additionally, the host may also have one or more additional mapping layers so that, for example, a host side logical device or volume is mapped to one or more data storage system logical devices as presented to the host.

As described above, the data storage system 12 may be a data storage array including a plurality of data storage devices 16a-16n in which one or more of the devices 16a-16n are flash memory devices employing one or more different flash memory technologies. In one embodiment, the data storage system 12 may be a Symmetrix® DMX™ or VMAX® data storage array by EMC Corporation of Hopkinton, Massachusetts. In the foregoing data storage array, the data storage devices 16a-16n may include a combination of disk devices and flash devices in which the flash devices may appear as standard Fibre Channel (FC) drives to the various software tools used in connection with the data storage array. The flash devices may be constructed using nonvolatile semiconductor NAND flash memory. The flash devices may include one or more SLC (single level cell) devices and/or MLC (multi level cell) devices.

It should be noted that the techniques herein may be used in connection with flash devices comprising what may be characterized as enterprise-grade or enterprise-class flash drives (EFDs) with an expected lifetime (e.g., as measured in an amount of actual elapsed time such as a number of years, months, and/or days) based on a number of guaranteed write cycles, or program cycles, and a rate or frequency at which the writes are performed. Thus, a flash device may be expected to have a usage measured in calendar or wall clock elapsed time based on the amount of time it takes to perform the number of guaranteed write cycles. The techniques herein may also be used with other flash devices, more generally referred to as non-enterprise class flash devices, which, when performing writes at a same rate as for enterprise class drives, may have a lower expected lifetime based on a lower number of guaranteed write cycles.

The techniques herein may be generally used in connection with any type of flash device, or more generally, any SSD technology. The flash device may be, for example, a flash device which is a NAND gate flash device, NOR gate flash device, flash device that uses SLC or MLC technology, and the like, as known in the art. In one embodiment, the one or more flash devices may include MLC flash memory devices although an embodiment may utilize MLC, alone or in combination with, other types of flash memory devices or other suitable memory and data storage technologies. More generally, the techniques herein may be used in connection with other SSD technologies although particular flash memory technologies may be described herein for purposes of illustration.

An embodiment in accordance with techniques herein may have one or more defined storage tiers. Each tier may generally include physical storage devices or drives having one or more attributes associated with a definition for that tier. For example, one embodiment may provide a tier definition based on a set of one or more attributes. The attributes may include any one or more of a storage type or storage technology, a type of data protection, device performance characteristic(s), storage capacity, and the like. The storage type or technology may specify whether a physical storage device is an SSD drive (such as a flash drive), a particular type of SSD drive (such using flash or a form of RAM), a type of magnetic disk or other non-SSD drive (such as rotating disk drives of various speeds or RPMs (revolutions per minute) (e.g., RPM, 15K RPM) using one or more interfaces such as FC, NL-SAS, SAS, SATA, etc.), and the like. Data protection may specify a type or level of data storage protection such, for example, as a particular RAID level (e.g., RAID1, RAID-5 3+1, RAIDS 7+1, and the like). Performance characteristics may relate to different performance aspects of the physical storage devices of a particular type or technology. For example, there may be multiple types of FC or SAS disk drives based on the RPM characteristics of the FC or SAS disk drives (e.g., 10K RPM drives and 15K RPM drives) and disk drives having different RPM characteristics may be included in different storage tiers. Storage capacity may specify the amount of data, such as in bytes, that may be stored on the drives. An embodiment may allow a user to define one or more such storage tiers. For example, an embodiment in accordance with techniques herein may define two storage tiers including a first tier of all SSD drives and a second tier of all non-SSD drives. As another example, an embodiment in accordance with techniques herein may define three storage tiers including a first tier of all SSD drives which are flash drives, a second tier of all 15K RPM drives, and a third tier of all 7.2K RPM drives. The foregoing are some examples of tier definitions and other tier definitions may be specified in accordance with techniques herein.

Figure 3:
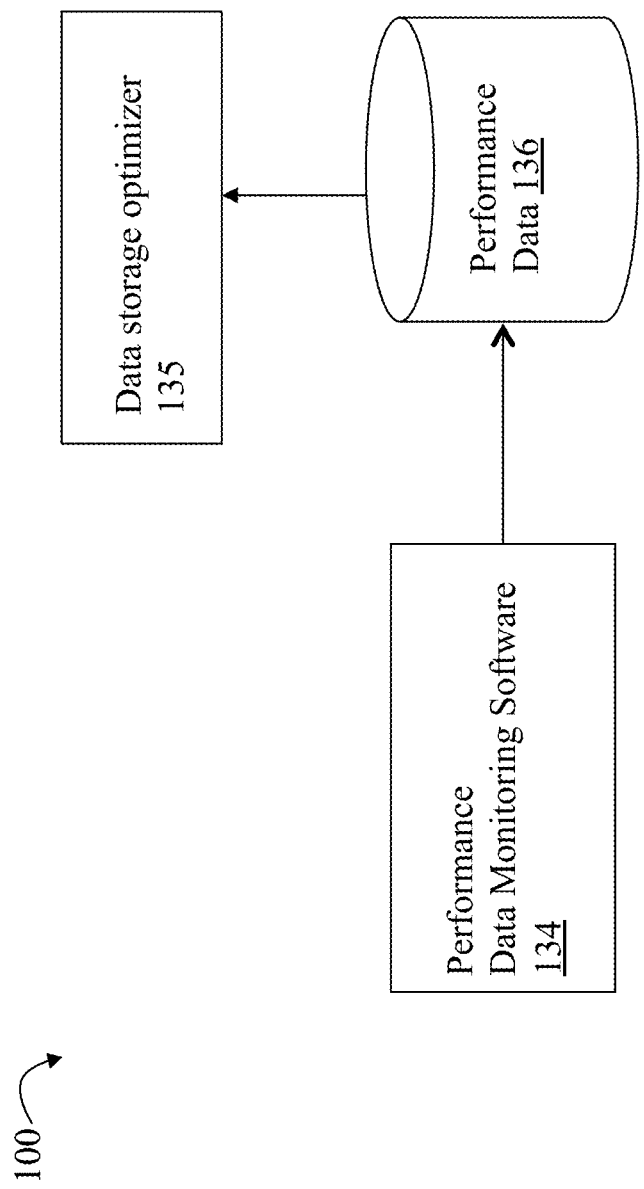
FIG. 3 is an example representing components that may be included in a service processor in an embodiment in accordance with techniques herein.

Referring to FIG. 3, shown is an example 100 of components that may be used in an embodiment in connection with techniques herein. The example 100 includes performance data monitoring software 134 which gathers performance data about the data storage system. The software 134 may gather and store performance data 136. This performance data 136 may also serve as an input to other software, such as used by the data storage optimizer 135 in connection with performing data storage system optimizations, which attempt to enhance the performance of I/O operations, such as those I/O operations associated with data storage devices 16a-16n of the system 12 (as in FIG. 1). For example, the performance data 136 may be used by a data storage optimizer 135 in an embodiment in accordance with techniques herein. The performance data 136 may be used in determining and/or optimizing one or more statistics or metrics such as may be related to, for example, a workload for one or more physical devices, a pool or group of physical devices, logical devices or volumes (e.g., LUNs), thin or virtually provisioned devices (described in more detail elsewhere herein), portions of thin devices, and the like. The I/O workload may also be a measurement or level of "how busy" a device is, for example, in terms of I/O operations (e.g., I/O throughput such as number of I/Os/second, response time (RT), and the like). Examples of workload information and other information that may be obtained and used in an embodiment in accordance with techniques herein are described in more detail elsewhere herein.

In one embodiment in accordance with techniques herein, components of FIG. 3, such as the performance monitoring software 134, performance data 136 and/or data storage optimizer 135, may be located and execute on a system or processor that is external to the data storage system. For example, in one embodiment, any one or more of the foregoing components may be located and execute on service processor 22a. As an alternative or in addition to having one or more components execute on a processor external to the data storage system, one or more of the foregoing components may be located and execute on a processor of the data storage system itself.

The response time for a storage device or volume may be based on a response time associated with the storage device or volume for a period of time. The response time may be based on read and write operations directed to the storage device or volume. Response time represents the amount of time it takes the storage system to complete an I/O request (e.g., a read or write request). Response time may be characterized as including two components: service time and wait time. Service time is the actual amount of time spent servicing or completing an I/O request after receiving the request from a host via an HA 21, or after the storage system 12 generates the I/O request internally. The wait time is the amount of time the I/O request spends waiting in line or queue waiting for service (e.g., prior to executing the I/O operation).

It should be noted that the operations of read and write with respect to a LUN, thin device, and the like, may be viewed as read and write requests or commands from the DA 23, controller or other backend physical device interface. Thus, these are operations may also be characterized as a number of operations with respect to the physical storage device (e.g., number of physical device reads, writes, and the like, based on physical device accesses). This is in contrast to observing or counting a number of particular type of I/O requests (e.g., reads or writes) as issued from the host and received by a front end component such as an HA 21. To illustrate, a host read request may not result in a read request or command issued to the DA if there is a cache hit and the requested data is in cache. The host read request results in a read request or command issued to the DA 23 to retrieve data from the physical drive only if there is a read cache miss. Furthermore, when writing data of a received host I/O request to the physical device, the host write request may result in multiple reads and/or writes by the DA 23 in addition to writing out the host or user data of the request. For example, if the data storage system implements a RAID data protection technique, such as RAID-5, additional reads and writes may be performed such as in connection with writing out additional parity information for the user data. Thus, observed data gathered to determine workload, such as observed numbers of reads and writes, may refer to the read and write requests or commands performed by the DA. Such read and write commands may correspond, respectively, to physical device accesses such as disk reads and writes that may result from a host I/O request received by an HA 21.

The optimizer 135 may perform processing, for example, s to determine how to allocate or partition physical storage in a multi-tiered environment for use by multiple applications. The optimizer 135 may also perform other processing such as, for example, to determine what particular portions of thin devices to store on physical devices of a particular tier, evaluate when to move data between physical drives of different tiers, and the like. It should be noted that the optimizer 135 may generally represent one or more components that perform processing as described herein as well as one or more other optimizations and other processing that may be performed in an embodiment.

The data storage optimizer may perform processing to determine what data portions of devices such as thin devices to store on physical devices of a particular tier in a multi-tiered storage environment. Such data portions of a thin device may be automatically placed in a storage tier where the techniques herein have determined the storage tier is best to service that data in accordance with criteria described herein. The data portions may also be automatically relocated or moved to a different storage tier as the work load and observed performance characteristics for the data portions change over time. In accordance with techniques herein, analysis of performance data for data portions of thin devices may be performed in order to determine whether particular data portions should have their data contents stored on physical devices located in a particular storage tier. Data movements and placement of data in particular storage tiers may take into account how "busy" the data portions are in combination with defined capacity limits and defined performance limits (e.g., such as I/O throughput or I/Os per unit of time, response time, utilization, I/O density such as I/Os per second per unit of storage, and the like) associated with a storage tier in order to evaluate which data to store on drives of the storage tier. Additionally, the data movements and placement of data in particular storage tiers may also consider service level objectives (SLOs) associated with storage groups. A storage group (SG) may generally define a logical grouping of one or more devices, such as one or more logical devices such as thin or virtually provisioned devices. The foregoing and other details are further discussed in following paragraphs.

Promotion may refer to movement of data from a first storage tier to a second storage tier where the second storage tier is characterized as having devices of higher performance than devices of the first storage tier. Demotion may refer generally to movement of data from a first storage tier to a second storage tier where the first storage tier is characterized as having devices of higher performance than devices of the second storage tier. As such, movement of data from a first tier of flash devices to a second tier of 15K RPM devices and/or 7.2K RPM devices may be characterized as a demotion and movement of data from the foregoing second tier to the first tier a promotion. The promotion and demotion thresholds refer to thresholds used in connection with data movement.

In accordance with techniques herein, an embodiment may include a data storage optimizer that determines amounts of the different storage tiers used to store an application's data, and thus the application's storage group, at various points in time. Criteria used to determine what tier upon which to store different portions of data may use one or more performance metrics indicating a workload of the application. For example, an embodiment may determine one or more performance metrics using collected or observed performance data for a plurality of different logical devices, and/or portions thereof, used by the application. Thus, the partitioning of the different storage tiers among multiple applications may also take into account the workload or how "busy" an application is. Such criteria may also include capacity limits specifying how much of each particular storage tier may be used to store data for the application's logical devices as well as I/O workload limits associated with the different storage tiers.

In at least one embodiment in following paragraphs, reference may be made in examples to a storage environment having three storage tiers such as a first tier of only flash drives in the data storage system, a second tier of only 15K RPM disk drives, and a third tier of only 7.2K RPM disk drives. In terms of performance, the foregoing three tiers may be ranked from highest to lowest as follows: first, second, and then third. The lower the tier ranking, the lower the tier's performance characteristics (e.g., longer latency times, capable of less I/O throughput/second/GB (or other storage unit), and the like). Generally, different types of physical devices or physical drives have different types of characteristics. There are different reasons why one may want to use one storage tier and type of drive over another depending on criteria, goals and the current performance characteristics exhibited in connection with performing I/O operations. For example, flash drives of the first tier may be a best choice or candidate for storing data which may be characterized as I/O intensive or "busy" thereby experiencing a high rate of I/Os to frequently access the physical storage device containing the LUN's data. However, flash drives tend to be expensive in terms of storage capacity. The 7.2K RPM drives may be a best choice or candidate for storing data of devices requiring a large storage capacity and which are not I/O intensive with respect to access and retrieval from the physical storage device. The second tier of 15K RPM disk drives may be characterized as "in between" flash drives and 7.2K RPM drives in terms of cost/GB and I/O performance. Thus, in terms of relative performance characteristics, flash drives may be characterized as having higher performance than both 15K RPM and 7.2K RPM disks, and 15K RPM disks may be characterized as having a higher performance than 7.2K RPM disks.

Since flash drives of the first tier are the best suited for high throughput/sec/GB, processing may be performed to determine which of the devices, and portions thereof, are characterized as most I/O intensive and therefore may be good candidates to have their data stored on flash drives. Similarly, the second most I/O intensive devices, and portions thereof, may be good candidates to store on 15K RPM disk drives of the second tier and the least I/O intensive devices may be good candidates to store on 7.2K RPM drives of the third tier. As such, I/O workload for an application may be determined using some measure of I/O intensity, performance or activity (e.g., I/O throughput/second (e.g., I/Os per second), percentage of read operation, percentage of write operations, response time, etc.) of each device used for the application's data. Some measure of workload may be used as a factor or criterion in combination with others described herein for determining what data portions are located on the physical storage devices of each of the different storage tiers.

Figure 4:
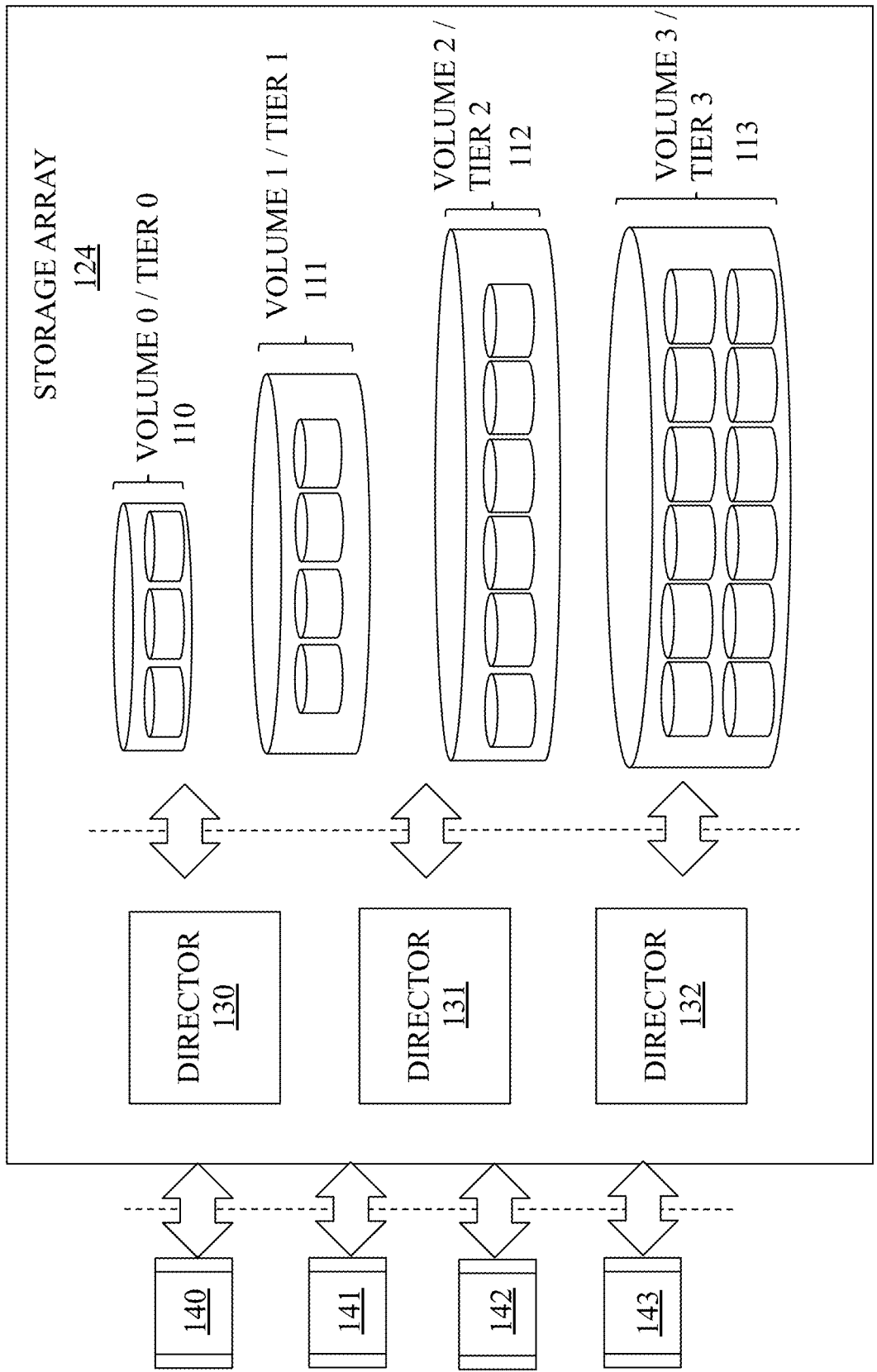
FIGS. 4, 5A and 5B are examples illustrating a data storage system, such as data storage array, including a plurality of storage tiers in an embodiment in accordance with techniques herein.

FIG. 4 is a schematic illustration showing a storage system 150 that may be used in connection with an embodiment of the system described herein. The storage system 150 may include a storage array 124 having multiple directors 130-132 and multiple storage volumes (LUNs, LVs, logical devices or VOLUMES 0-3) 110-113. Host applications 140-144 and/or other entities (e.g., other storage devices, SAN switches, etc.) request data writes and data reads to and from the storage array 124 that are facilitated using one or more of the directors 130-132. The storage array 124 may include similar features as that discussed above.

The volumes 110-113 may be provided in multiple storage tiers (TIERS 0-3) that may have different storage characteristics, such as speed, cost, reliability, availability, security and/or other characteristics. As described above, a tier may represent a set of storage resources, such as physical storage devices, residing in a storage platform. Examples of storage disks that may be used as storage resources within a storage array of a tier may include sets of 7.2K RPM disks, 15K RPM disks and/or EFDs, among other known types of storage devices.

According to various embodiments, each of the volumes 110-113 may be located in different storage tiers. Tiered storage provides that data may be initially allocated to a particular fast volume/tier, but a portion of the data that has not been used over a period of time (for example, three weeks) may be automatically moved to a slower (and perhaps less expensive) tier. For example, data that is expected to be used frequently, for example database indices, may be initially written directly to fast storage whereas data that is not expected to be accessed frequently, for example backup or archived data, may be initially written to slower storage. In an embodiment, the system described herein may be used in connection with a Fully Automated Storage Tiering (FAST) product produced by EMC Corporation of Hopkinton, Massachusetts, that provides for the optimization of the use of different storage tiers including the ability to easily create and apply tiering policies (e.g., data movement policies, and the like) to transparently automate the control, placement, and movement of data within a storage system based on business needs. The data storage optimizer may be used to determine amounts or allocations of each storage tier used by each application based on capacity limits in combination with performance limits for the different storage tiers in combination with consideration of various service level objectives (SLOs) for different storage groups. In one embodiment, the FAST product may be the data storage optimizer 135 which performs data movement optimizations such as described herein.

Figure 5A:
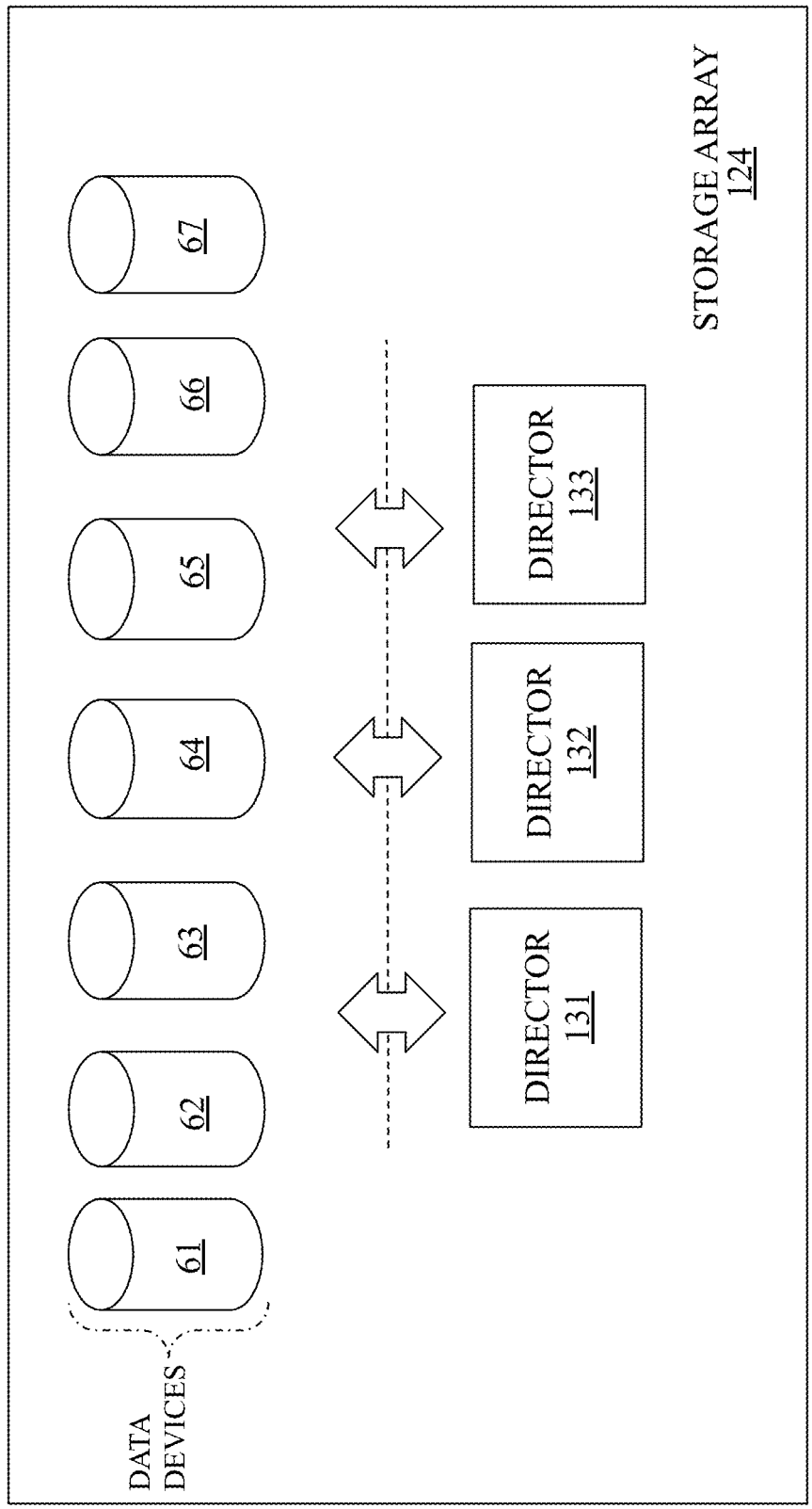

Referring to FIG. 5A, shown is a schematic diagram of the storage array 124 as including a plurality of data devices 61-67 communicating with directors 131-133. The data devices 61-67 may be implemented as logical devices like standard logical devices (also referred to as thick devices) provided in a Symmetrix® data storage system produced by EMC Corporation of Hopkinton, Massachusetts, for example. In some embodiments, the data devices 61-67 may not be directly useable (visible) to hosts coupled to the storage array 124. Each of the data devices 61-67 may correspond to a portion (including a whole portion) of one or more of the disk drives 42-44 (or more generally physical devices). Thus, for example, the data device section 61 may correspond to the disk drive 42, may correspond to a portion of the disk drive 42, or may correspond to a portion of the disk drive 42 and a portion of the disk drive 43. The data devices 61-67 may be designated as corresponding to different classes, so that different ones of the data devices 61-67 correspond to different physical storage having different relative access speeds or RAID protection type (or some other relevant distinguishing characteristic or combination of characteristics), as further discussed elsewhere herein. Alternatively, in other embodiments that may be used in connection with the system described herein, instead of being separate devices, the data devices 61-67 may be sections of one data device.

Figure 5B:
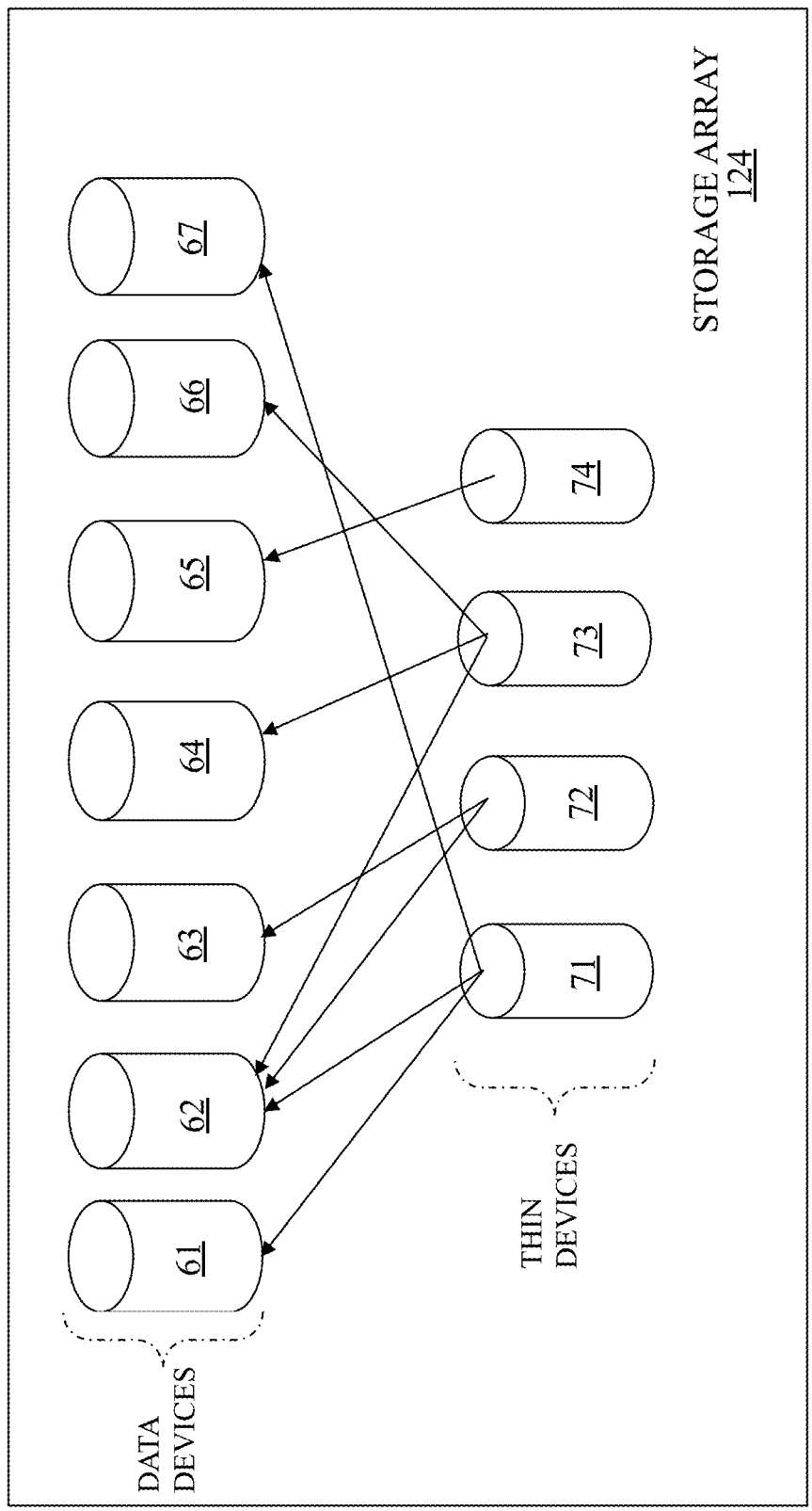

As shown in FIG. 5B, the storage array 124 may also include a plurality of thin devices 71-74 that may be adapted for use in connection with the system described herein when using thin provisioning. In a system using thin provisioning, the thin devices 71-74 may appear to a host coupled to the storage array 124 as one or more logical volumes (logical devices) containing contiguous blocks of data storage. Each of the thin devices 71-74 may contain pointers to some or all of the data devices 61-67 (or portions thereof). As described in more detail elsewhere herein, a thin device may be virtually provisioned in terms of its allocated physical storage in physical storage for a thin device presented to a host as having a particular capacity is allocated as needed rather than allocate physical storage for the entire thin device capacity upon creation of the thin device. As such, a thin device presented to the host as having a capacity with a corresponding LBA (logical block address) range may have portions of the LBA range for which storage is not allocated.

Figure 5C:
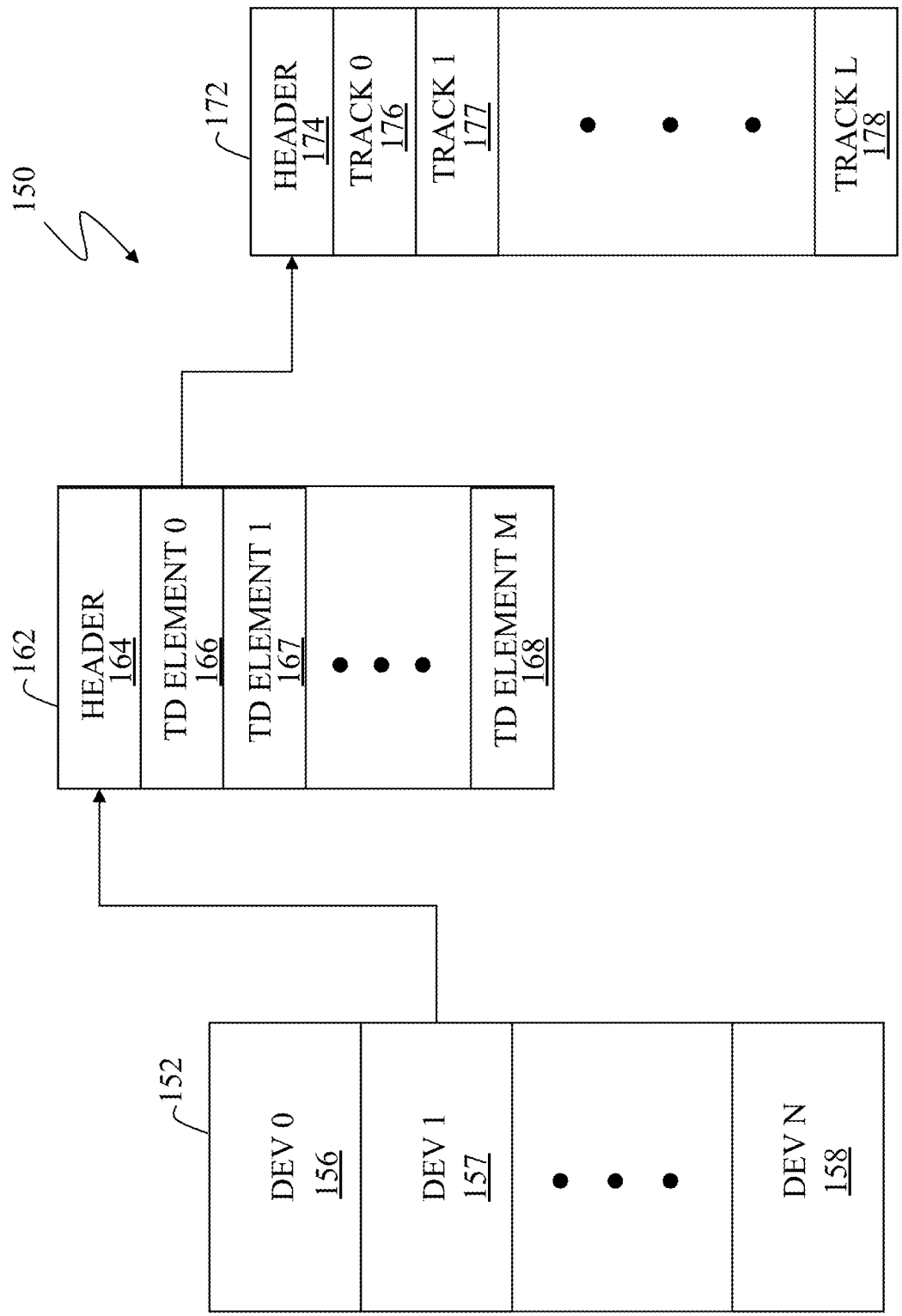
FIG. 5C is a schematic diagram illustrating tables that are used to keep track of device information in connection with an embodiment of the system described herein.

Referring to FIG. 5C, shown is a diagram 150 illustrating tables that are used to keep track of device information. A first table 152 corresponds to all of the devices used by a data storage system or by an element of a data storage system, such as an HA 21 and/or a DA 23. The table 152 includes a plurality of logical device (logical volume) entries 156-158 that correspond to all the logical devices used by the data storage system (or portion of the data storage system). The entries in the table 152 may include information for thin devices, for data devices (such as logical devices or volumes), for standard logical devices, and/or any or all other types of logical devices used in connection with the system described herein.

Each of the entries 156-158 of the table 152 correspond to another table that may contain information for one or more logical volumes, such as thin device logical volumes. For example, the entry 157 may correspond to a thin device table 162. The thin device table 162 may include a header 164 that contains overhead information, such as information identifying the corresponding thin device, information concerning the last used data device and/or other information including counter information, such as a counter that keeps track of used group entries (described below). The header information, or portions thereof, may be available globally to the data storage system.

The thin device table 162 may include one or more group elements 166-168, that contain information corresponding to a group of tracks on the data device. A group of tracks may include one or more tracks, the number of which may be configured as appropriate. In an embodiment herein, each group has sixteen tracks, although this number may be configurable.

One of the group elements 166-168 (for example, the group element 166) of the thin device table 162 may identify a particular one of the data devices 61-67 having a track table 172 that contains further information, such as a header 174 having overhead information and a plurality of entries 176-178 corresponding to each of the tracks of the particular one of the data devices 61-67. The information in each of the entries 176-178 may include a pointer (either direct or indirect) to the physical address on one of the physical disk drives of the data storage system that maps to the logical address(es) of the particular one of the data devices 61-67. Thus, the track table 162 may be used in connection with mapping logical addresses of the logical devices corresponding to the tables 152, 162, 172 to physical addresses on the disk drives or other physical devices of the data storage system.

The tables 152, 162, 172 may be stored in the global memory 25b of the data storage system. In addition, the tables corresponding to particular logical devices accessed by a particular host may be stored (cached) in local memory of the corresponding one of the HA's. In addition, an RA and/or the DA's may also use and locally store (cache) portions of the tables 152, 162, 172.

Figure 5D:
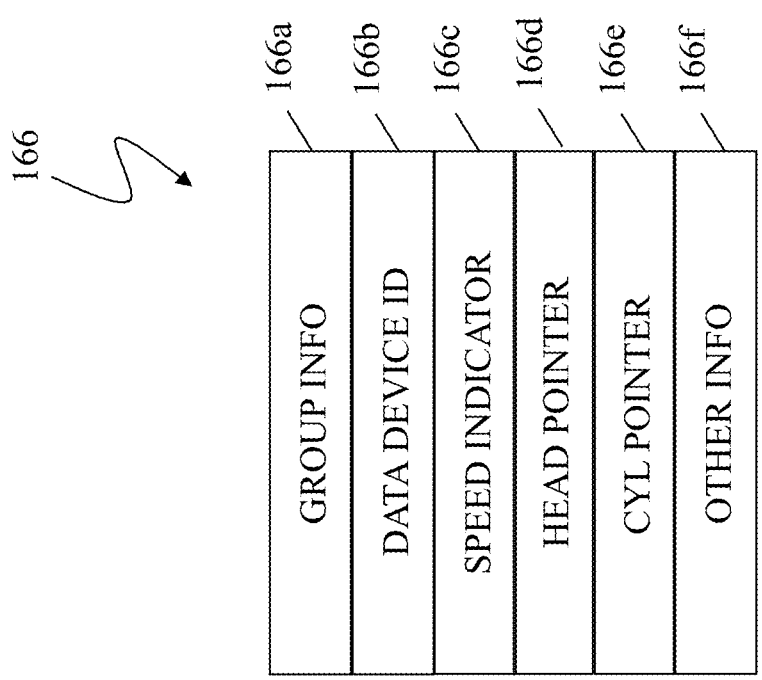
FIG. 5D is a schematic diagram showing a group element of a thin device table in connection with an embodiment of the system described herein.

Referring to FIG. 5D, shown is a schematic diagram illustrating a group element 166 of the thin device table 162 in connection with an embodiment of the system described herein. The group element 166 may include a plurality of entries 166a-166f The entry 166a may provide group information, such as a group type that indicates whether there has been physical address space allocated for the group. The entry 166b may include information identifying one (or more) of the data devices 61-67 that correspond to the group (i.e., the one of the data devices 61-67 that contains pointers for physical data for the group). The entry 166c may include other identifying information for the one of the data devices 61-67, including a speed indicator that identifies, for example, if the data device is associated with a relatively fast access physical storage (disk drive) or a relatively slow access physical storage (disk drive). Other types of designations of data devices are possible (e.g., relatively expensive or inexpensive). The entry 166d may be a pointer to a head of the first allocated track for the one of the data devices 61-67 indicated by the data device ID entry 166b. Alternatively, the entry 166d may point to header information of the data device track table 172 immediately prior to the first allocated track. The entry 166e may identify a cylinder of a first allocated track for the one the data devices 61-67 indicated by the data device ID entry 166b. The entry 166f may contain other information corresponding to the group element 166 and/or the corresponding thin device. In other embodiments, entries of the group table 166 may identify a range of cylinders of the thin device and a corresponding mapping to map cylinder/track identifiers for the thin device to tracks/cylinders of a corresponding data device. In an embodiment, the size of table element 166 may be eight bytes.

Accordingly, a thin device presents a logical storage space to one or more applications running on a host where different portions of the logical storage space may or may not have corresponding physical storage space associated therewith. However, the thin device is not mapped directly to physical storage space. Instead, portions of the thin storage device for which physical storage space exists are mapped to data devices, which are logical devices that map logical storage space of the data device to physical storage space on the disk drives or other physical storage devices. Thus, an access of the logical storage space of the thin device results in either a null pointer (or equivalent) indicating that no corresponding physical storage space has yet been allocated, or results in a reference to a data device which in turn references the underlying physical storage space.

Thin devices and thin provisioning are described in more detail in U.S. patent application Ser. No. 11/726,831, filed Mar. 23, 2007 (U.S. Patent App. Pub. No. 2009/0070541 A1), AUTOMATED INFORMATION LIFE-CYCLE MANAGEMENT WITH THIN PROVISIONING, Yochai, and U.S. Pat. No. 7,949,637, Issued May 24, 2011, Storage Management for Fine Grained Tiered Storage with Thin Provisioning, to Burke, both of which are incorporated by reference herein.

As discussed elsewhere herein, the data devices 61-67 (and other logical devices) may be associated with physical storage areas (e.g., disk drives, tapes, solid state storage, etc.) having different characteristics. In various embodiments, the physical storage areas may include multiple tiers of storage in which each sub-tier of physical storage areas and/or disk drives may be ordered according to different characteristics and/or classes, such as speed, technology and/or cost. The devices 61-67 may appear to a host coupled to the storage device 24 as a logical volume (logical device) containing a contiguous block of data storage, as discussed herein. Accordingly, each of the devices 61-67 may map to storage areas across multiple physical storage drives. The granularity at which the storage system described herein operates may be smaller than at the file level, for example potentially as small as a single byte, but more practically at the granularity of a single logical block or collection of sequential data blocks. A data block may be of any size including file system or database logical block size, physical block, track or cylinder and/or other size. Multiple data blocks may be substantially the same size or different sizes, such as different size data blocks for different storage volumes or different sized data blocks within a single storage volume.

An embodiment may allow for locating all of the data of a single logical portion or entity in a same tier or in multiple different tiers depending on the logical data portion or entity. In an embodiment including thin devices, different portions of data of a single thin device may be located in different storage tiers. As such, an embodiment in accordance with techniques herein may have added flexibility in that the first portion of data of the thin device may be located in a different higher performance storage tier than the second portion. For example, the first portion may be located in a tier comprising flash devices and the second portion may be located in a different tier of 15K RPM or 7.2K RPM drives.

Data used in connection with techniques herein, such as the performance data of FIG. 3 used in determining device and SG workloads, may be obtained through observation and monitoring actual performance. Data may also be determined in other suitable ways such as, for example, through simulation, estimation, and the like. Observed or collected data may be obtained as described in connection with FIG. 3 by monitoring and recording one or more aspects of I/O activity for each TD (thin or virtually provisioned device), and portions thereof. For example, for each TD, and/or portions thereof, an average number of reads occurring within a given time period may be determined, an average number of writes occurring within a given time period may be determined, an average number of read misses occurring within a given time period may be determined, and the like. It should be noted that the operations of read and write with respect to a TD may be viewed as read and write requests or commands from the DA, controller or other backend physical device interface. Thus, these are operations may also be characterized as a average number of operations with respect to the physical storage device (e.g., average number of physical device reads, writes, and the like, based on physical device accesses). This is in contrast to observing or counting a number of particular type of I/O requests (e.g., reads or writes) as issued from the host and received by a front end component such as an FA. To illustrate, a host read request may not result in a read request or command issued to the DA if there is a cache hit and the requested data is in cache. The host read request results in a read request or command issued to the DA to retrieve data from the physical drive only if there is a read miss. Furthermore, when writing data of a received host I/O request to the physical device, the host write request may result in multiple reads and/or writes by the DA in addition to writing out the host or user data of the request. For example, if the data storage system implements a RAID data protection technique, such as RAID-5, additional reads and writes may be performed such as in connection with writing out additional parity information for the user data. Thus, observed data gathered to determine workload, such as observed numbers of reads and writes, may refer to the read and write requests or commands performed by the DA. Such read and write commands may correspond, respectively, to physical device accesses such as disk reads and writes that may result from a host I/O request received by an FA.

It should be noted that movement of data between tiers from a source tier to a target tier may include determining free or unused storage device locations within the target tier. In the event there is an insufficient amount of free of unused storage in the target tier, processing may also include displacing or relocating other data currently stored on a physical device of the target tier. An embodiment may perform movement of data to and/or from physical storage devices using any suitable technique.

One embodiment in accordance with techniques herein may include multiple storage tiers including a first tier of flash devices and one or more other tiers of non-flash devices having lower performance characteristics than flash devices. The one or more other tiers may include, for example, one or more types of disk devices. The tiers may also include other types of SSDs besides flash devices.

As described above, a thin device (also referred to as a virtual provision device) is a device that represents a certain capacity having an associated address range. Storage may be allocated for thin devices in chunks or data portions of a particular size as needed rather than allocate all storage necessary for the thin device's entire capacity. Therefore, it may be the case that at any point in time, only a small number of portions or chunks of the thin device actually are allocated and consume physical storage on the back end (on physical disks, flash or other physical storage devices). A thin device may be constructed of chunks having a size that may vary with embodiment. For example, in one embodiment, a chunk may correspond to a group of 12 tracks (e.g., 12 tracks*64 Kbytes/track=768 Kbytes/chunk). As also noted with a thin device, the different chunks may reside on different data devices in one or more storage tiers. In one embodiment, as will be described below, a storage tier may consist of one or more storage pools. Each storage pool may include multiple LUNs and their associated physical devices. With thin devices, a system in accordance with techniques herein has flexibility to relocate individual chunks as desired to different devices in the same as well as different pools or storage tiers. For example, a system may relocate a chunk from a flash storage pool to a 7.2K RPM storage pool. In one embodiment using techniques herein, a thin device can be bound to a particular storage pool of a storage tier at a point in time so that any chunks requiring allocation of additional storage, such as may occur when writing data to the thin device, result in allocating storage from this storage pool. Such binding may change over time for a thin device.

A thin device may contain thousands and even hundreds of thousands of such chunks. As such, tracking and managing performance data such as one or more performance statistics for each chunk, across all such chunks, for a storage group of thin devices can be cumbersome and consume an excessive amount of resources. In embodiments of the data storage optimizer, performance data about thin devices may be collected where such information may be used to determine which chunks of thin devices are most active relative to others. Such evaluation may be performed in connection with evaluating where to locate and/or move data of the different chunks with respect to the different storage tiers in a multi-storage tier environment. In connection with examples in following paragraphs, details such as having a single storage pool in each storage tier, a single storage group, and the like, are provided for purposes of illustration. Those of ordinary skill in the art will readily appreciate the more general applicability of techniques herein in other embodiments.

Figure 6A:
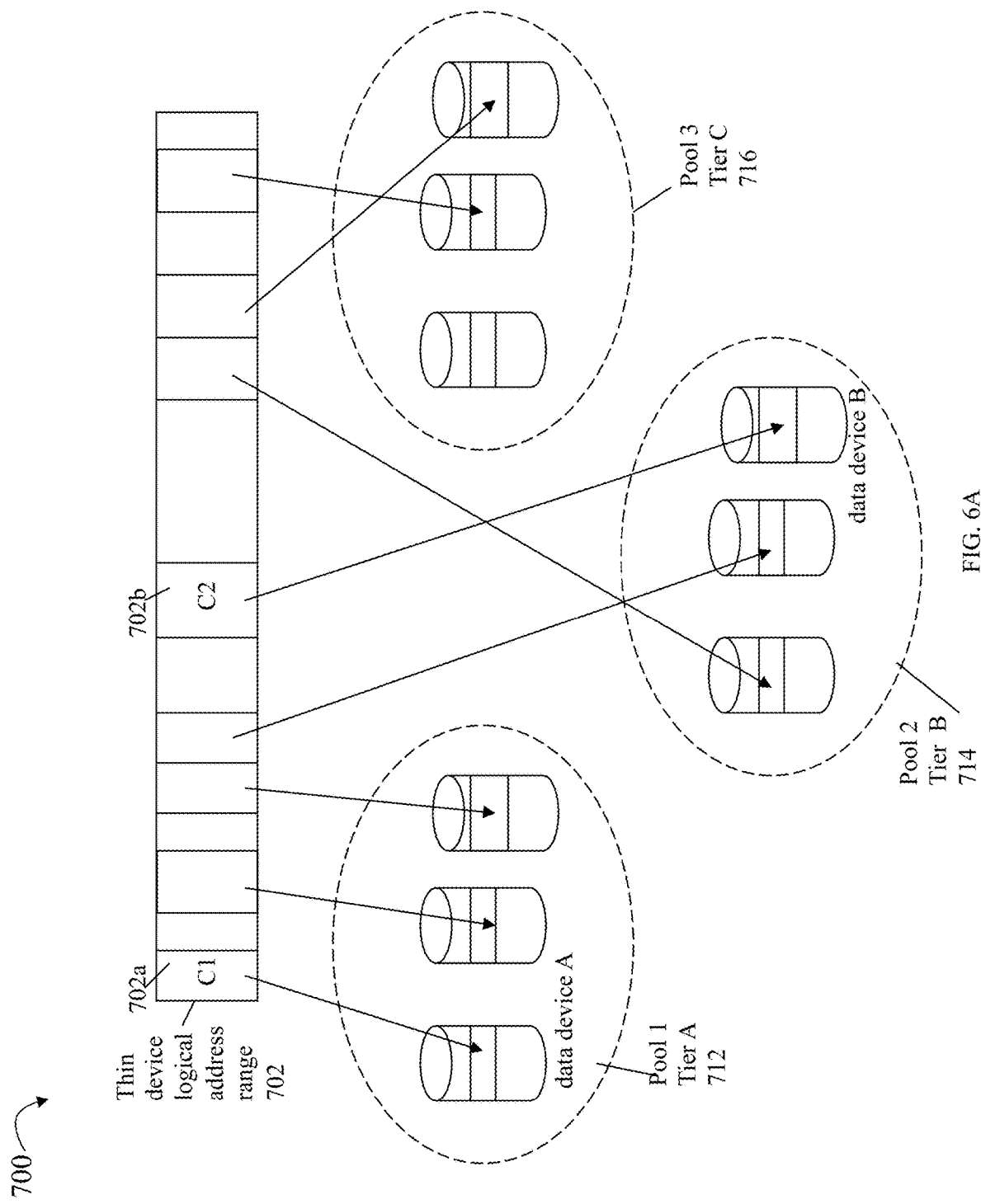
FIGS. 6A and 6B are examples illustrating thin devices and associated structures that may be used in an embodiment in accordance with techniques herein.

Referring to FIG. 6A, shown is an example 700 illustrating use of a thin device in an embodiment in accordance with techniques herein. The example 700 includes three storage pools 712, 714 and 716 with each such pool representing a storage pool of a different storage tier. For example, pool 712 may represent a storage pool of tier A of flash storage devices, pool 714 may represent a storage pool of tier B of 15K RPM storage devices, and pool 716 may represent a storage pool of tier C of 7.2K RPM storage devices. Each storage pool may include a plurality of logical devices and associated physical devices (or portions thereof) to which the logical devices are mapped. Element 702 represents the thin device address space or range including chunks which are mapped to different storage pools. For example, element 702a denotes a chunk C1 which is mapped to storage pool 712 and element 702b denotes a chunk C2 which is mapped to storage pool 714. Element 702 may be a representation for a first thin device which is included in a storage group of one or more thin devices.

It should be noted that although the example 700 illustrates only a single storage pool per storage tier, an embodiment may also have multiple storage pools per tier.

Figure 6B:
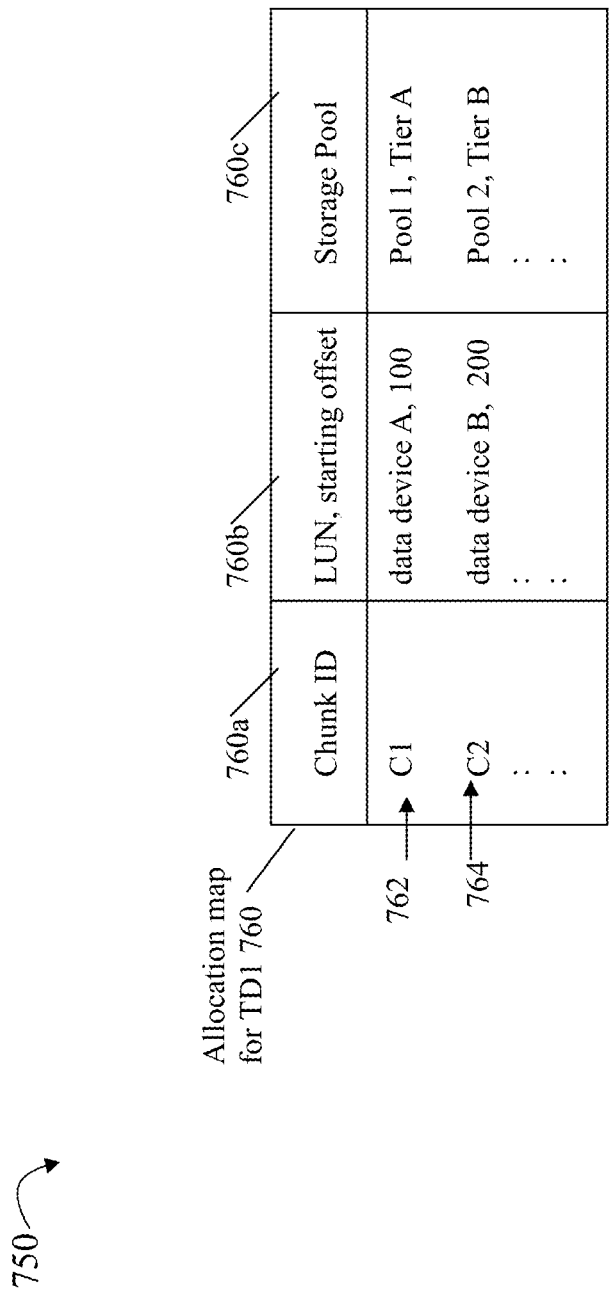

Referring to FIG. 6B, shown is an example representation of information that may be included in an allocation map in an embodiment in accordance with techniques herein. An allocation map may be used to identify the mapping for each thin device (TD) chunk (e.g. where each chunk is physically located). Element 760 represents an allocation map that may be maintained for each TD. In this example, element 760 represents information as may be maintained for a single TD although another allocation map may be similarly used and maintained for each other TD in a storage group. Element 760 may represent mapping information as illustrated in FIG. 6A such as in connection the mapping of 702 to different storage pool devices. The allocation map 760 may contain an entry for each chunk and identify which data device and associated physical storage is mapped to the chunk. For each entry or row of the map 760 corresponding to a chunk, a first column 760a, Chunk ID, denotes an identifier to uniquely identify the chunk of the TD, a second column 760b, indicates information about the data device and offset to which the chunk is mapped, and a third column storage pool 760c denotes the storage pool and tier including the data device of 760b. For example, entry 762 represents chunk C1 illustrated in FIG. 6A as 702a and entry 764 represents chunk C2 illustrated in FIG. 6A as 702b. It should be noted that although not illustrated, the allocation map may include or otherwise use other tables and structures which identify a further mapping for each data device such as which physical device locations map to which data devices. This further mapping for each data device is described and illustrated elsewhere herein such as, for example, with reference back to FIG. 5B. Such information as illustrated and described in connection with FIG. 6B may be maintained for each thin device in an embodiment in accordance with techniques herein.

In connection with collecting statistics characterizing performance, I/O workload and/or activity for a thin device, one approach may be to collect the information per chunk or, more generally, for the smallest level of granularity associated with allocation and deallocation of storage for a thin device. Such statistics may include, for example, a number of reads/unit of time, #writes/unit of time, a number of prefetches/unit of time, and the like. However, collecting such information at the smallest granularity level does not scale upward as number of chunks grows large such as for a single thin device which can have up to, for example 300,000 chunks. In one embodiment, data may be allocated for thin devices in chunk size units the first time there is a write to any logical address to which the chunk is mapped.

Therefore, an embodiment in accordance with techniques herein may collect statistics on a grouping of "N" chunks also referred to as an extent, where N represents an integer number of chunks, N>0. N may be, for example, 480 in one embodiment. Each extent may represent a consecutive range or portion of the thin device in terms of thin device locations (e.g., portion of the address space or range of the thin device). Note that the foregoing use of consecutive does not refer to physical storage locations on physical drives but rather refers to consecutive addresses with respect to a range of addresses of the thin device which are then mapped to physical device locations which may or may not be consecutive, may be on the same or different physical drives, and the like. For example, in one embodiment, an extent may be 480 chunks (N=480) having a size of 360 MBs (megabytes).

An extent may be further divided into subextents, where each subextent is a collection of M chunks. M may be, for example 10 in one embodiment. In one embodiment, the sub-extent size may correspond to the smallest granularity of data movement. In other words, the subextent size represents the atomic unit or minimum amount of data that can be operated upon when performing a data movement such as between storage tiers.

Figure 7:
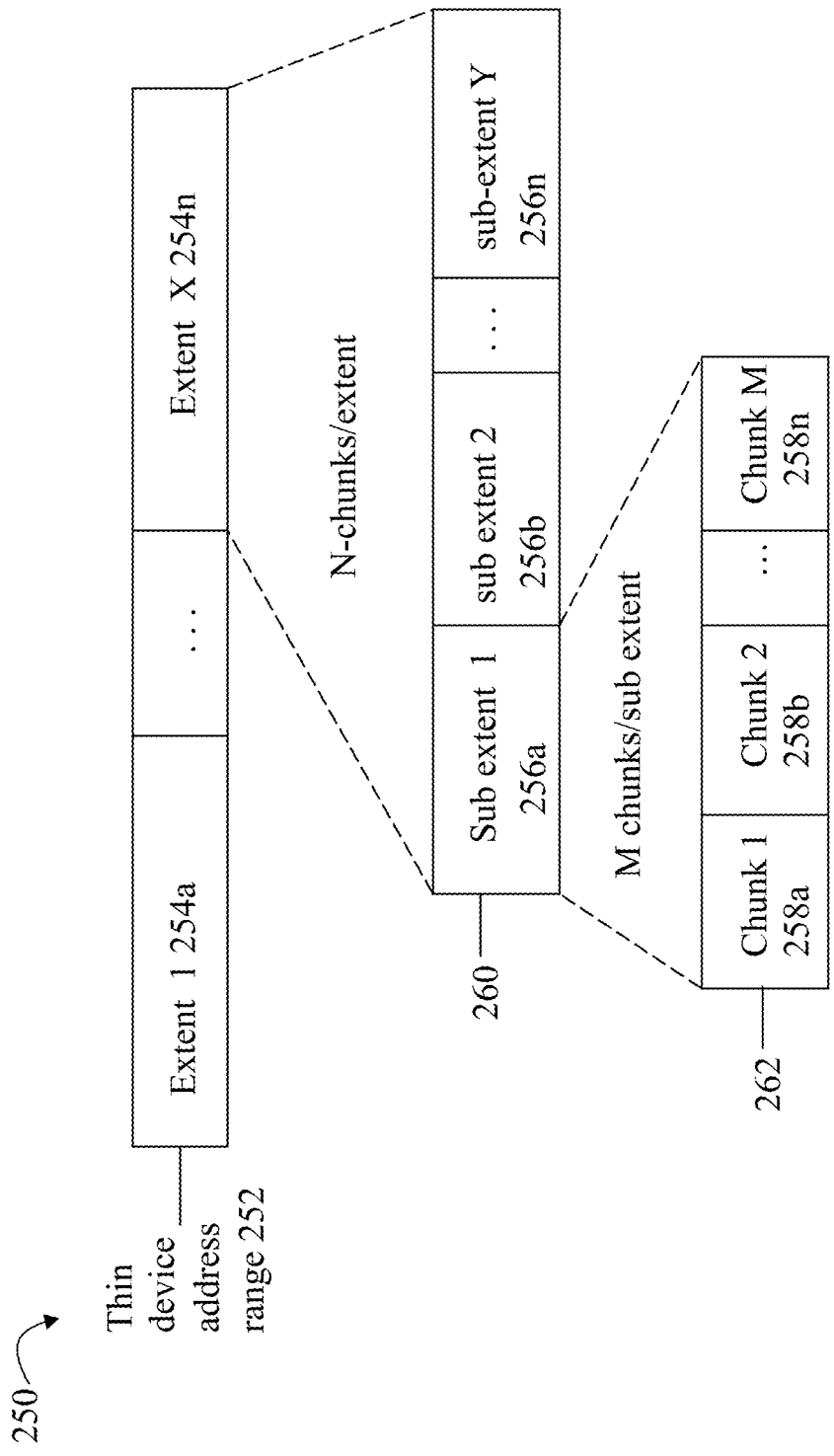
FIG. 7 is an example illustrating data portions comprising a thin device's logical address range.

Referring to FIG. 7, shown is an example illustrating partitioning of a thin device's address space or range in an embodiment in accordance with techniques herein. The example 250 includes a thin device address space or range 252 which, as described elsewhere herein, includes chunks mapped to physical storage locations. The thin device address space or range 252 may be partitioned into one or more extents 254a-254n. Each of the extents 254a-254n may be further partitioned into sub-extents. Element 260 illustrates that extent X 254n may include subextents 256a-256n. Although only detail is illustrated for extent 254n, each of the other extents of the thin device also include a same number of subextents as illustrated for 254n. Each of the subextents 256a-256n may represent a grouping of "M" chunks. Element 262 illustrates that subextent 1 256a may include chunks 258a-258n. Although only detail is illustrated for subextent 256a, each of the other subextents 256b-256n also include a same number of "M" chunks as illustrated for 256a. Thus, each of the extents 254a-254n may represent an grouping of "N" chunks, where $$N = \#subextents/extent * M\ chunks/subextent \quad \text{EQUATION B1}$$

An embodiment in accordance with techniques herein may collect statistics for each extent, or more generally data portion, as described in more detail elsewhere herein.

It should be noted that although the techniques described herein are used with thin devices providing virtual storage provisioning, the techniques herein may also be used in connection with other types of devices such as those not providing virtual provisioning.

With reference back to FIG. 3, the data storage optimizer may perform processing including, for example, determining how to allocate or partition physical storage in a multi-tiered environment for use by multiple applications. The optimizer may perform processing such as, for example, to determine what particular portions of LUNs, thin devices, and the like, to store on physical devices of a particular tier, evaluate when to move data between physical drives of different tiers, and the like. In connection with description herein, embodiments are described whereby the optimizer may be included as a component of the data storage system, such as a data storage array. In such embodiments, the optimizer may perform optimizations, such as the data movement optimization, with respect to physical devices of a single data storage system such as a single data storage array. Such data movement optimizations may be performed with respect to different data storage units of granularity that may be vary with embodiment and/or type of logical devices. For example, an embodiment may provide for partitioning data of a logical device (as may be stored on one or more physical devices (PDs)) into multiple data portions of any suitable size. The data movement optimization processing may provide for evaluation and data movement of individual data portions (each of which can be much less than the size of entire LUN or other logical device such as a thin or virtually provisioned logical device) between storage tiers based on the workload or activity of I/Os directed to each such data portion. As the I/O workload may change dynamically over time, the data storage optimizer may continuously evaluate and perform data movement optimizations between different storage tiers as needed responsive to such changing workloads.

It should be noted that a single target data storage system (such as one receiving I/O requests from one or more hosts) may be connected to one or more other external data storage systems whereby one or more storage tiers managed by the data storage optimizer of the target data storage system include storage located on such external data storage systems. For example, the target system may include the three storage tiers as described above and also include a fourth storage tier of physical storage devices located on an external data storage system whereby the data storage optimizer of the target system performs automated data movement optimizations between storage tiers including those three tiers having physical devices located on the target system and additionally including physical devices of the tier located on the external data storage system. The external data storage system and its storage may be accessible to a host indirectly through the target data storage system. In this manner, the host or other client may send I/Os to the target system and physical storage for the I/Os may be located on physical device of the target system or another external data storage system connected to the target system.

In such an embodiment, the data storage optimizer may be located in the target data storage system that performs data storage optimizations, such as data movement and other optimizations, for PDs stored on the first data storage system. Additionally, the optimizer, or more generally, the one or more components performing the optimization processing, may perform data storage optimizations with respect to such externally located data storage systems and PDs. For example, the target data storage system receiving host I/Os may be connected, directly or through a network or other connection, to a one or more external data storage systems. The optimizer of the target data storage system may perform data storage optimizations such as data movement optimizations with respect to PDs of the first data storage system and also other PDs of the one or more other external data storage systems. In this manner, the data storage optimizer may perform data storage optimizations of its own local devices and/or other devices physically located in another component other than the data storage system. In other words, the for performing data movement evaluation, performing the actual movement of data such as between physical devices of different storage tiers, and the like, may be performed by code executing on a component that is external with respect to the data storage system including the physical devices for which such data movement optimization is performed.

As noted herein, the storage tiering environment may be a multi-tiered storage environment. Physical devices (PDs) comprising the storage tiers may be included in logical groupings referred to as pools or storage pools (SPs). The storage tiers, and also the SPs, may be classified based on criteria including performance characteristics such as expected average response time (RT) for completing an I/O operation. In this manner, the PDs comprising each of the storage tiers (and thus the SPs comprising those tier) may be categorized without requiring knowledge of the underlying storage technology, such as SSD, a particular type of SSD such as MLC, SLC and the like) or a particular type of rotating disk drive (e.g., such as 7.2K RPM, 10K RPM, etc. by a particular vendor). It should be noted that in some embodiments, the storage tiers and associated SPs may include such PD characteristics related to the underlying hardware technology in combination with other performance characteristics including expected average RT. Classifying storage tiers based on expected average RT may prove more effective, efficient and for better optimization of resource usage.

Additionally, techniques herein provide for modeling, suggesting and/or performing data movements in accordance with criteria including performance goals or targets customized for particular applications as well as for SPs. Performance criteria for each application, or logical grouping of applications based on the underlying logical devices commonly used, may vary. As described herein, an SG may refer to logical devices used by a single application or such a single logical grouping. Performance criteria for each SG may be vary with each application and may be based on the particular customized performance expectations or requirements of each application. In this manner, performance criteria for each SG may affect selection of which SPs, and underlying PDs, are used to store data of the application (e.g., which SPs store data of logical devices used by the particular application). Application or SG performance criteria may include an expected average RT (also referred to herein as an RT objective). The SG performance criteria may include performance targets or goals similar in respects to those as described for the SPs. For example, an average RT may be specified as the RT objective indicating an average expected RT for I/Os directed to the particular SG. For example, performance criteria for an application (and thus its SG) may be obtained from a service level agreement or objective whereby a service provider who owns or manages the data storage system is providing services to a third party using the application and the service provider has agreed to deliver a particular level of performance to the third party for a price included in a service agreement.

In accordance with techniques herein in deciding what storage resources, such as SPs or PDs, are to be used by an application, the resources may be generally viewed as a supply and the applications, or more generally consumers of the resources, may be viewed as a demand for the supply. The supply side may be controlled to deliver a scalable number of IOPS (I/Os per second or I/O rate) and have a certain storage capacity (e.g., such as in terms of bytes, GBs, and the like), optimized for a particular RT. The customer may control the performance goals of the SPs such as by varying the RT range or percentage range and/or expected average RT. It should be noted, however, that the customer should select an expected average RT and other performance criteria for a storage tier that is realistic and within the capabilities of the actual underlying PDs. If a customer makes an unrealistic selection such as for the average RT, the system may not be able to satisfy SP performance goals. A system may detect such conditions, such as when all SPs are always looking to move data to a higher performing tier to obtain SP-specific performance goals or targets. An embodiment may also provide for having the system automatically configure and specify values for the SP performance criteria. In some embodiments, an SP may include PDs of all the same underlying physical storage technology or may alternatively include PDs of more than a single technology. It should also be noted that an embodiment may or may not form SPs. For example, consider an embodiment forming SPs where each SP may include PDs of a single tier. Such an embodiment may form multiple SPs each including PDs of the same single tier. Alternatively, in a simple implementation, an embodiment may include a single SP of all PDs of a single tier. In this case, description herein with respect to an SP may be applied to each tier or at the tier level.

The demand may be managed per SG providing a relative priority based scheme since a first SG having a performance goal with a lower RT than a second SG will have a higher priority than the first SG and associated application(s) storing data and directing I/Os to devices of the first SG. In this manner, SG performance goals specify a relative priority for the different SGs and applications in terms of obtaining the higher/highest-performing SPs and PDs being managed on the supply side using techniques herein. A system using techniques herein may stabilize based on the overall load while also keeping the tiers (e.g., SPs and PDs) in their ideal RT range and providing the SGs with the best possible relative performance that the hardware is capable of In one embodiment, the logical devices to which I/Os of an application are directed may be thin or virtually provisioned logical devices as described elsewhere herein. However, it will be appreciated by those skilled in the art that techniques herein may be used with other logical device types to which application I/O is directed.

Figure 8:
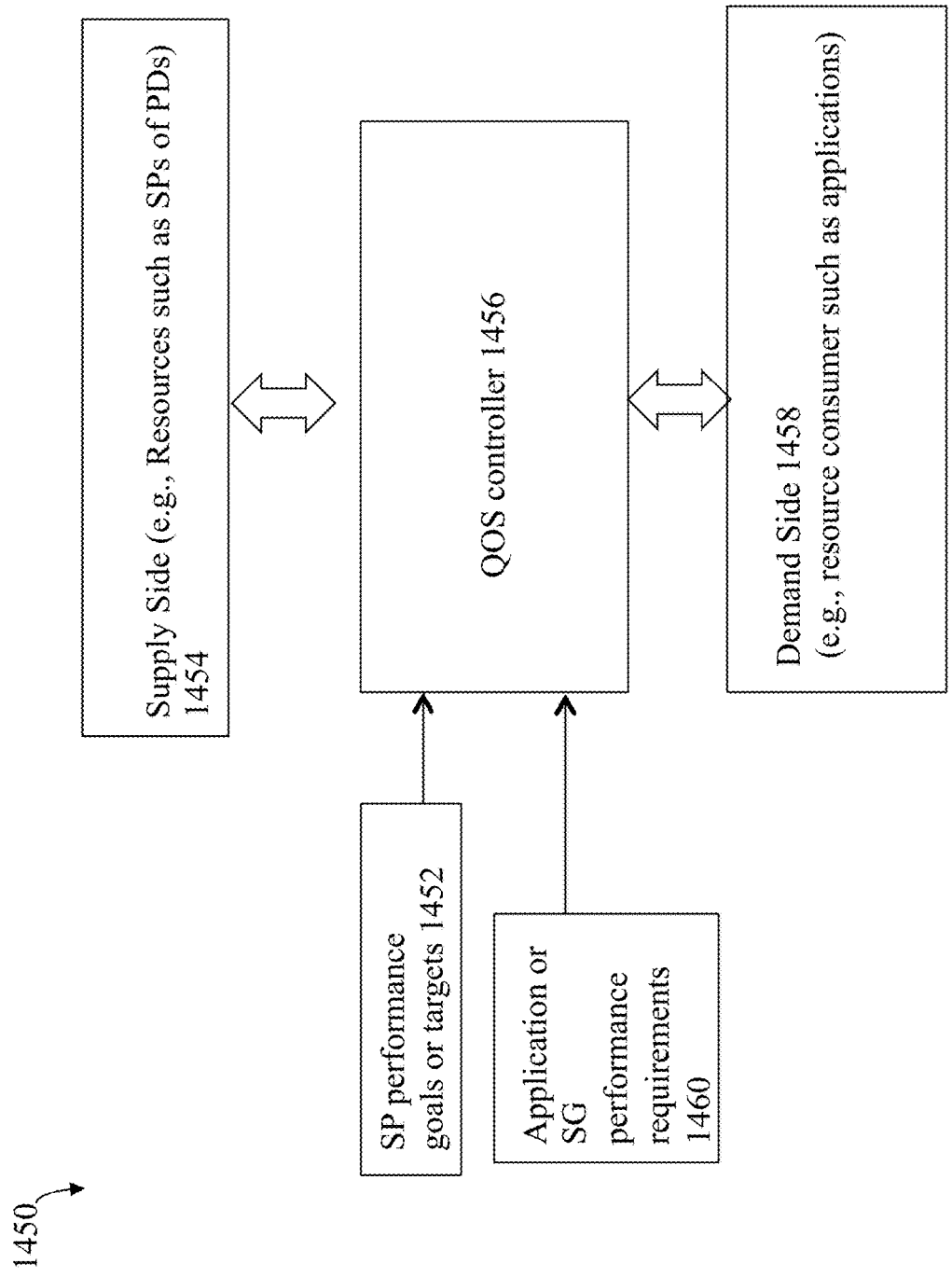
FIG. 8 is an example illustrating a QOS (quality of service) controller and other components that may be used in connection with techniques herein.

Referring to FIG. 8, shown is an example illustrating components and data that may be included and used in an embodiment in accordance with techniques herein. The example 1450 includes SP performance goals or targets 1452 which are specified for the storage resources of the supply side 1454. As noted above, the supply side 1454 may include the SPs or PDs in a data storage system under management using techniques herein. The SP performance goals or targets may be provided as an input to the QOS controller 1456. The demand side 1458 may include consumers of the supply side resources 1454. As noted above, the demand side 1458 may include applications storing their data on PDs of a data storage system where such PDs are included in the supply side 1454. Application or SG performance requirements 1460 may be specified for the applications included in the demand side 1458. The QOS controller 1456, such as may be included in an embodiment of the data storage optimizer, performs processing as described herein to attempt to best meet the demands of the demand side 1458 of the resources included in the supply side 1454 in accordance with the application or SG performance requirements 1460 and also meet the SP performance goals or targets 1452. An embodiment may consider meeting the health and performance goals of the SPs, and thus storage tiers, as a first or primary consideration and then attempting to best meet SG goals or performance requirements while maintaining the performance goals of the SPs, and thus storage tiers.

It should be noted that the techniques herein are described with respect to a particular type of supply and demand such as, respectively, PDs and applications. However, techniques herein may be more generally applicable for use with other resources and other consumers of those resources that may be included in a data storage system or other system under management using techniques herein.

As noted above, an RT objective may be included in the performance goals or targets defined for each SP or pool and also each SG. The RT objective may represent the mean or average RT expected. Thus, the RT objective for an SP represents the average expected RT for I/Os directed to the SP, and the RT objective for an SG represents the average expected RT for I/Os directed to the SG. Further, the RT objective for the SP may be used to classify the SP and its underlying PDs in accordance with a tiering classification as described herein representing the expected average RT based on the underlying performance capabilities of the physical storage media. The RT objective for the SG or application may be imply a relative priority with respect to other RT objectives for other SGs or applications.

An expected RT with respect to the supply side 1454 or resources, such as SPs of PDs, may also be referred to herein as a service level expectation (SLE). Similarly, an expected level of service, such as a response time objective (RTO) with respect to the demand side 1458 or resource consumers, such as SGs of the applications (or more generally consumers of resources on the demand size 1458), may also be referred to herein as a service level objective (SLO).

In an embodiment in accordance with techniques herein, different media types or technologies (e.g., flash or EFD, SAS or other 15K RPM rotating disk drive, SAS or other 10K RPM rotating disk drive) that are known may have an associated SLE denoting an expected level of performance for I/Os directed to PDs of a particular media type or technology. For example, as described herein, the SLE for an SLE class and its one or more media types may be an expected RT for I/Os directed to PDs of this particular SLE class. In this manner, one characteristic associated with a storage tier may be an SLE of the underlying physical storage devices. If two media types or technologies have the same SLE, they may both be included in the same SLE classification. Additionally, for PDs of the external data storage system whose media type and expected level of performance are unknown, performance information may be collected for the PDs where such information is used to establish an SLE for the PDs of the external data storage system.

In an embodiment in accordance with techniques herein, an SLO may be specified for one or more logical devices of a customer or tenant having data stored on the data storage system. In one embodiment in accordance with techniques herein, the data storage system may provide a multi-tenant (MT) environment whereby multiple tenants, or customers, store their data on the data storage system. In such an exemplary MT environment, a different service level objective or SLO may be specified for each tenant that defines a guaranteed performance level or performance goal for the tenant. For example, an SLO may be related to a guaranteed level of performance with respect to I/O operations serviced at the data storage system for the tenant. In this case, the SLO specified for the tenant may be expressed in terms of one or more metrics, such as based on response time (RT). For example, the SLO specified for the tenant may include an average response time (RT) with respect to I/Os issued by the tenant. To further illustrate, an SLO may specify an average RT of 3 ms. for the tenant whereby the tenant is guaranteed to have an average RT of 3 ms. for each LUN storing the tenant's data. The tenant may also be referred to as a customer or consumer of the data storage system having its data stored on the data storage system. A single tenant or customer may be, for example, one or more applications executing on a host. A single host may have one or more tenants or customers where each of the tenants or customers includes one or more applications. For simplicity of illustration, following examples may refer to a single application on a host as a tenant or customer for which an SLO is specified where the SLO may be applied to each LUN used by the application. However, it will be appreciated by those skilled in the art that an SLO, such as RT, specified for a single tenant or customer may be applied in the aggregate with respect to multiple applications and associated LUNs of the single tenant or customer.

The SLO may include an RT denoting a guaranteed or target level of performance as measured on the data storage system where the RT denotes an average RT per LUN. For example, the SLO may specify an RT for an application's LUNs. The application may be a database application and the SLO may specify a RT to be guaranteed for each of the LUNs used the application. The SLO may be met or maintained if the observed average RT over some time period is less than (or equal to or less than) the RTO of the SLO for each individual logical device (e.g., LUN that is a thin device, thick device or regular LUN, etc.) of the customer. The observed average RT may be determined with respect to front end or host I/O operations directed to the logical device. The SLO may be associated with a general level of service purchased by the customer.

The I/O workload characteristics may include a current I/O workload such as I/O throughput or I/O rate. In such an embodiment, the I/O workload may be expressed as I/Os per second (IOPS). The statistics such as I/O workload may be collected per extent. As a variation, an embodiment may use I/O workload density as a value to denote I/O workload. I/O workload density with respect to an extent may be the IOPS directed to the extent further divided by a unit of storage, such as per GB.

As noted above, an SLO may be specified which denotes a target level of performance. For example, as discussed elsewhere herein, an SLO may be a value denoting an average response time (RT) with respect to I/O operations, where the SLO may be specified for a particular application, customer, and the like. In one embodiment, an SLO may be specified for a storage group (SG) which is a defined group of one or more logical devices, such as one or more LUNs that may be virtually provisioned or other types of logical devices supported in an embodiment, where the SG is used by an application. In following paragraphs, examples of SLOs are specified each of which is a value denoting an average RT with respect to I/O operations directed to a particular SG. Thus, an embodiment may specify a different SLO customized for each SG of one or more logical devices.

In at least one embodiment, the SLO may be effectively an average RT for reads, and more specifically based on read misses since writes and read hits are acknowledged immediately due to the system caching architecture in such an embodiment. Although the SLO may denote such an average RT with respect to reads, the SLO may be more generally be any form of RT calculation.

In an embodiment in accordance with techniques herein, a first SLO may be specified for an SG. Consistent with description elsewhere herein, a data storage optimizer may perform processing to facilitate meeting and maintaining the SG-specified SLO such as through assessing whether SLOs are being met or violated and taking an action which attempts to meet the SLO or correct an SLO violation responsive to determining the occurrence of an SLO violation (e.g., SLO not being met). Such actions may be characterized as taking steps to facilitate correction of the SLO violation and may include, for example, determining proposed data movements candidates, selecting one or more of such proposed data movement candidates, modeling the selected proposed data movement candidates and then implementing the selected data movement candidates (e.g., by actually performing the selected data movements).

Described in following paragraphs are techniques that may be used in connection with modeling or simulating a data storage system including a data storage optimizer in order model hypothetical proposed changes input to the model in order to obtain predictions, such as regarding modeled RTs for each of the SGs if such proposed changes are made. Generally, the modelling tool may be used to determine how performance will be impacted for the SGs based on particular modifications. The modeling may include modeling performance of the data storage optimizer that performs data movements and placement of data of the different SGs under its management in particular storage tiers. For example, the modeling may include determining predicted RTs for the SGs if the I/O workload of a particular application/SG is increased or decreased, if a new application/SG is added, if an application/SG is removed, if an one or more SLOs each for a different SG is modified, if the data storage configuration is modified (e.g., to add or remove PDs of one or more storage tiers, to increase the size of the cache thereby improving read and write data caching), and the like. As described in more detail below and elsewhere herein, such modeling may include modeling performance of the data storage optimizer which in at least one embodiment ensures that the storage system is "healthy" in the sense that no storage tier is overloaded whereby specified modeled I/O workload for each storage tier does not exceed a specified maximum (e.g., where a tier workload exceeding such specified maximum may be considered unhealthy). Additionally, the modeling takes into account also meeting specified SLOs for the SGs while also maintaining a current workload of the different storage pools, or storage tiers within specified healthy workload limits for each tier. The foregoing may be performed while simulating the placement of data portions of various SGs (e.g., placement of data in the various storage tiers as performed by the data storage optimizer) considering the particular I/O workloads for the various SGs.

Such a modeling tool in accordance with techniques as described in following paragraphs may be used by a customer, for example, to know a predicted performance impact on the data storage system for specified changes, such as changes to SG-specific I/O workloads, data storage system configuration changes, and the like.

It should be noted that in following paragraphs and description regarding processing performed by the modeling tool or simulator 310, processing may be described which places or moves data, swaps extents, and the like. As will generally be appreciated by those skilled in the art, such data movements or placements being performed by the simulator are not actual data movements but rather are modeled or virtual movements of data placements on particular tiers for the "what if" modeling. The what if modeling may model data placement as would be performed by the data storage optimizer executing in the data storage system having the hypothetically specified data storage system configuration (as included in the inputs). Thus, techniques herein model the particular data storage system configuration as well as model the data movements as may be performed by the data storage optimizer executing on a data storage system with the particular data storage system configuration.

Figure 9:
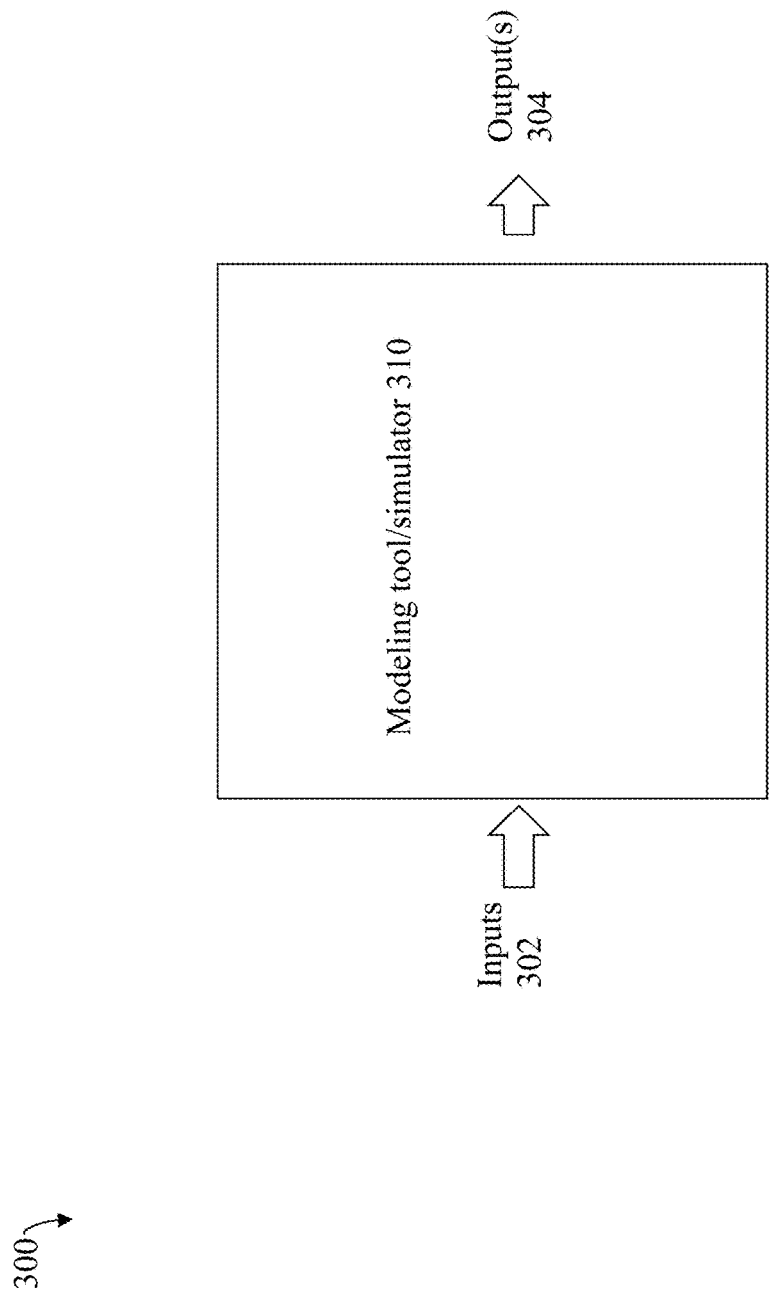
FIG. 9 is an example representing a modeling tool or simulator that may be used in an embodiment in accordance with techniques herein.

Referring to FIG. 9, shown is an example 300 representing an embodiment of a modeling tool or simulator 310 in accordance with techniques herein. The modeling tool or simulator 310 may receive one or more inputs which are used in modeling processing performed on the data storage system including modeling the data storage optimizer that places data of one or more SGs on various storage tiers of the data storage system. Generally, the modeling tool or simulator 310 may generate one or more outputs 304 as a result of modeling performed. The inputs 302 may include, for each SG being modeled, an SLO and the total I/O workload of the SG. The total I/O workload may be expressed in any suitable one or more metrics. For example, in one embodiment, the total I/O workload denoting the total I/O activity or I/O demand directed to any logical address of a LUN of the SG may be a total number of IOPS (I/Os per second).

It should be noted that the total I/O workload for an SG may be characterized as a backend I/O workload based on the number of I/Os to physical storage (PDs) of the backend such as directed to the DA when reading and/or writing data with respect to backend PDs. The SLO may be expressed in terms of RT with respect to front end I/Os such as host or client I/Os. As mentioned elsewhere herein, the SLO for an SG may be an average RT with respect to the reads directed to the SG.

The inputs 302 may include information regarding the data storage system configuration such as related to the physical storage devices. For example, the data storage configuration information may include the number of storage tiers, for each tier, the total storage capacity (e.g. in GBs or other units) of the storage tier, the number of pool(s) of PDs in each tier, the specified RAID-level and RAID group configurations for groups of PDs of each tier, and the like. For each storage tier, inputs may also relate to the total or aggregated maximum I/O workload capability of the storage tier (e.g. maximum number of IOPS this tier can handle). It should be noted that the total or aggregated maximum I/O workload capability of a storage tier may be determined, for example, based on maintaining a desired SLE for the storage tier (e.g., where the SLE may be expressed as an average RT with respect to backend I/O workloads). The one or more inputs may also include an SLE for each of the storage tiers.

It should be noted that certain changes to the data storage configuration besides modifications regarding the PDs may result in modification to one of the inputs 302 to the model. For example, if the amount of cache is increased, the number of FAs or DAs increases, and the like, such an increase may impact the I/O workload input in 302 to the simulator 310. In this manner, this is how such a modification to the data storage system may be reflected in the modeling in an embodiment in accordance with techniques herein. To further illustrate, increasing the amount of cache may decrease the number of read misses and increase the number of read hits. Thus, the I/O workload to the backend input to the simulator 310 may decrease. An embodiment in accordance with techniques herein may further model or otherwise determine the resulting I/O workload for such changes. In one embodiment of the simulator 310, processing is performed to model placement of data of the various SGs and associated I/O workloads included in inputs 302 based on the data storage system configuration also included in 302. The data storage system configuration may specifically related to the back-end PD configuration based on storage tiers, storage pool configurations and total capacity of the tiers. However, in at least one embodiment of the simulator 310, the impact upon I/O workload resulting from other changes besides those related to the backend PD configuration (e.g., including capacity of each tier) may be modeled or otherwise determined using any suitable technique.

The one or more outputs 304 may include a modeled or predicted amount of each storage tier (e.g., such as in GBs) allocated to each SG. Furthermore the one or more outputs may include a modeled average RT for each SG based on the modeled or simulated placement of the SG data for the SG's I/O workload (as included in the inputs 302). As described in following paragraphs, once it is determined how much of each tier is allocated to an SG, the SLE specified for each tier may be used as the average RT for tier to determine an overall average RT for the SG. The one or more outputs 304 may also include an overall modeled average RT for the data storage system, such as an average RT for all SGs of the data storage system.

As described herein, the simulator 310 performs its modeling in accordance with processing performed by the data storage optimizer to distribute data of the SGs in the various storage tiers and thus allocates portions of the various storage tiers among the SGs (e.g., for placing data of the various SGs on its allocated tier portions). Such modeling may be performed also in accordance with two goals. A first goal is to ensure that each tier is not overloaded whereby the tiers and pools of storage tiers do not exceed specified workload maximums. In one embodiment described in following paragraphs, the maximum I/O workload tier limit for a tier may be expressed as a maximum number of IOPS (for both reads and writes) that the tier is capable of performing without being considered overloaded. A second goal is to attempt to achieve SLOs for the SGs under consideration based on the inputs 302. Thus the processing performed by the simulator or modeling tool 310 may attempt to achieve both the foregoing goals while also determining an amount of each tier allocated to each SG and determining a predicted SG RT for each SG by modeling processing performed by the data storage optimizer for a specified data storage system configuration (e.g., PD configuration for storage tiers as included in inputs 302).

Figure 10:
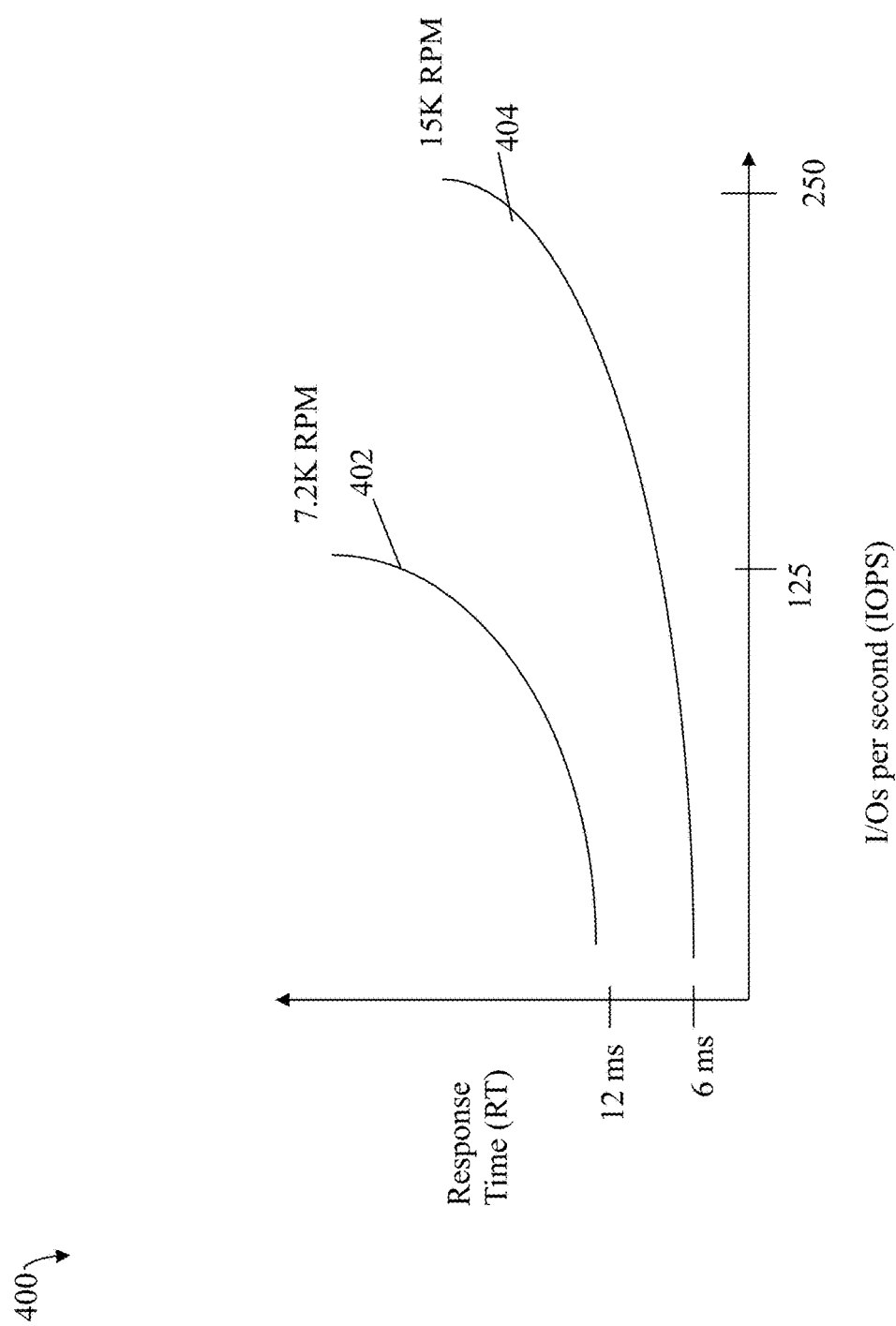
FIG. 10 is an example of performance curves that may be used in determining maximum workload capabilities of different types of storage devices and thus tiers comprising such different types of storage devices.

It should be noted that the maximum I/O workload tier limit may be determined using any suitable technique such as using testing, simulation, and the like. For example, in one embodiment, an RT performance curve for different PDs of particular storage tiers may be obtained such as illustrated in FIG. 10 and used in determining the maximum I/O workload tier limit based on the number of each such PD in a particular tier configuration. For example, curve 402 may denote observed performance data expressed as a RT on the Y axis obtained for different amounts of IOPS for a 7.2K RPM rotating disk drive. Curve 404 may denote observed performance data expressed as a RT on the Y axis obtained for different amounts of IOPS for a RPM rotating disk drive. The maximum number of IOPS for a single PD may be determined based on a desired RT for the PD, such as where the knee of the curves 402, 404 begin to turn upward. From this, a maximum number of IOPS for a number of such PDs in a storage configuration may be determined.

In at least one embodiment, the inputs 302 of FIG. 9 may also include a skew graph characterizing the I/O workload of each individual SG. An embodiment may determine or calculate the skew graph for each SG based on observed I/O workload. More generally, a skew graph or other form of input that may be used in an embodiment may denote a distribution of an I/O workload across the different extents or data portions of a logical address space, such as for a single SG, multiple SGs, and the like. As described in more detail in following paragraph, the skew graph or other form of input denoting a distribution and ranking of the I/O workload of the different extents across a logical address space may be used in connection with various processing steps performed by the simulator or modeling tool in an embodiment in accordance with techniques herein, for example, to determine an amount of data to be placed by modeling on a particular storage tier.

Figure 11:
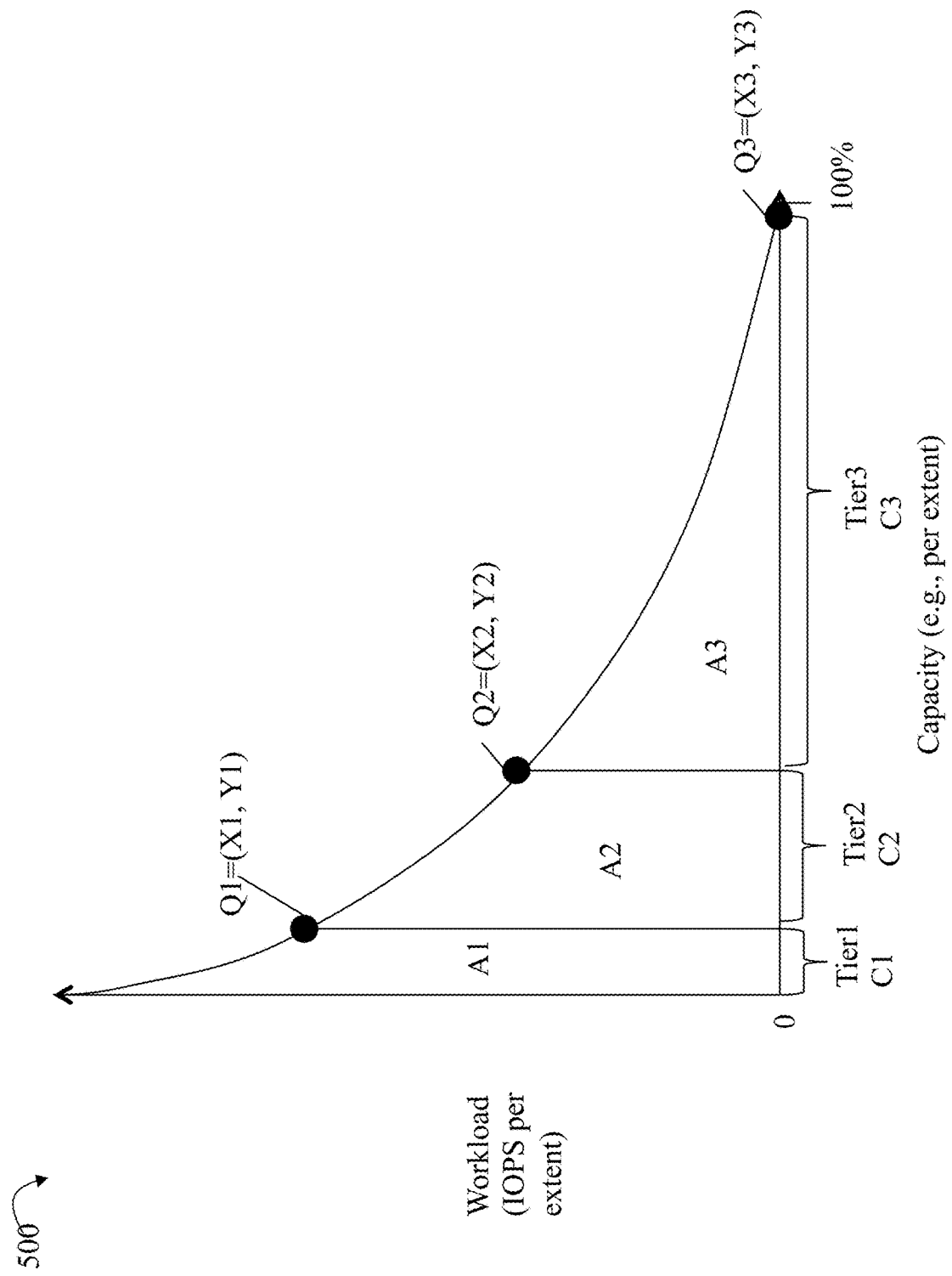
FIGS. 11 and 12 are examples illustrating skew graphs that may represent I/O workload distribution of a storage group, or more generally, logical address space, in an embodiment in accordance with techniques herein.

Referring to FIG. 11, shown is an example of a skew graph that may be used in an embodiment in accordance with techniques herein to represent the non-cumulative skew function. The skew graph of the example 500 may be determined based on data collected for a logical address space, such as associated with a single SG. The graph 500 includes total workload, such as in IOPS, per extent, on the Y axis and total capacity of the logical address space (e.g., across all LUNs of the SG) on the X axis. The graph 500 may represent the I/O workload directed to each extent of the capacity considered, such as for each extent of the SG where the extents are ordered from busiest/highest I/O workload (e.g., left most capacity extents) to slowest/lowest I/O workload (e.g., rightmost capacity extents) with those extents having the highest I/O workloads appearing from left to right.

Noted in the graph are capacities C1, C2, C3 and activities A1, A2 and A3 (corresponding to the various areas under the curve denoted by A1, A2, and A3). In this example, there may be 3 storage tiers, ranked in terms of performance, from highest to lowest, tier 1, tier 2 and tier 3. C1, C2 and C3 may denote, respectively, the capacities of tiers 1, 2 and 3. Thus, C1 may represent the total capacity of those extents that are the busiest or most active data portions (e.g., having the largest of all workloads of all data portions) such as may be stored in tier 1. C2 may represent the total capacity of the next ranked busiest or next most active data portions stored in tier 2. C3 may represent the total capacity of the least active data portion (e.g., data portions having the lowest workload or activity) stored in tier 3. A1 may represent the area under the skew curve which represents the percentage of the workload or activity directed to data stored in tier 1, which is the busiest of the data extents of the SG. A2 may represent the area under the skew curve which represents the percentage of the workload or activity directed to data stored in tier 2, which is the next busiest of the data extents of the SG. A3 may represent the area under the skew curve which represents the workload or activity directed to data stored in tier 3, which is the least active of the data extents of the SG (e.g., data having the lowest workload or activity). Thus, FIG. 11 may denote the placement of data based on I/O workload where the busiest extents having the highest workload are placed on highest performance tier.

It should be noted that the skew graph of FIG. 11 illustrates one way in which data may be placed. More generally, a skew graph such as in FIG. 11 may be used as described in following paragraphs for a single SG or for a group of multiple SGs in connection with modeling or placement of data, such as placement of the data portions having the lowest I/O workloads.

Figure 12:
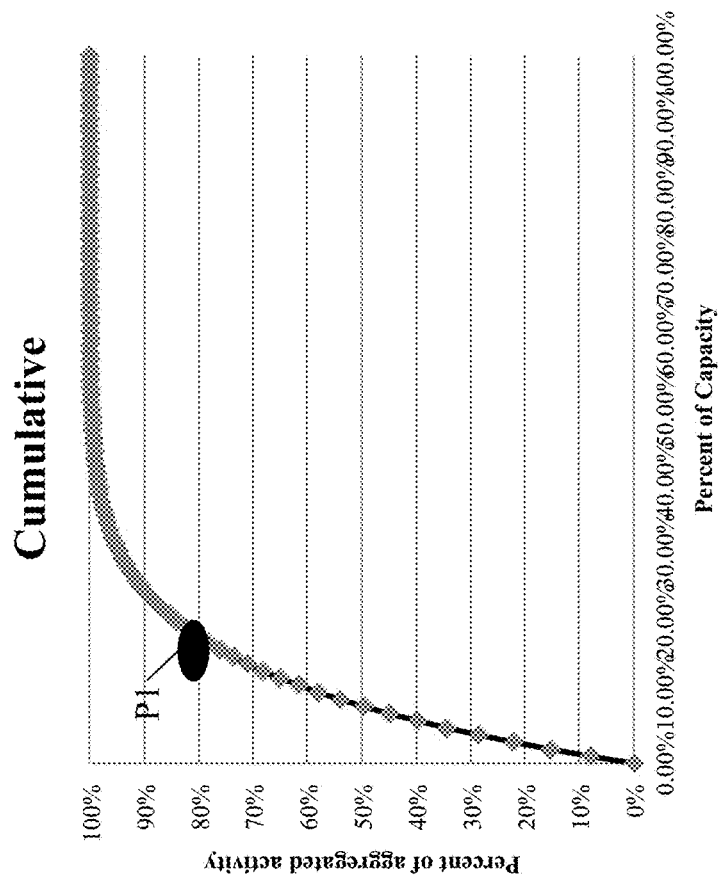

Referring to FIG. 12, shown is an example of a cumulative workload skew graph as may be determined from a corresponding base or non-cumulative workload skew function such as illustrated in FIG. 11. In FIG. 12, the Y axis represents the total I/O workload directed to an aggregated capacity and the X axis denotes the total capacity (extents).

To determine the cumulative workloads skew graph for FIG. 11, for example, the IOPS of each extent considered from left to right may be summed to denote the total or aggregate IOPS (workload) on the Y axis of the extents having the total aggregated LUN capacity noted on the X axis.

As known in the art, skew for a particular workload directed to an SG or other logical address space of extents may generally be characterized by a single point on the cumulative skew graph, where N %+M %=100%, where approximately N % of the total I/O workload is directed to M % of the total capacity or logical address space under consideration, such as for a single SG. For example, with reference to FIG. 12, the point P1 denotes that point at which approximately 80% of the workload is directed to 20% of the capacity.

As such, the I/O workload distribution directed to an SG may be characterized as having a particular skew. The greater the difference between N and M, the higher the skew. A lower skew (e.g., where the difference between N and M is closer) may be associated with a flatter cumulative skew curve. In contrast, a higher skew (e.g., where the difference between N and M is greater) may be associated with a steeper, less flat cumulative skew curve.

Following paragraphs illustrate use of techniques herein for modeling and simulating in a multi-tiered storage environment include 3 storage tiers denoted, in terms of performance ranking (highest to lowest) tier 1, tier 2 and tier 3. More generally, techniques herein may be extended for use with any number of tiers, generally two or more tiers.

In following paragraphs, MAX-3 denotes the total or aggregated maximum I/O workload capability of tier 3, MAX-2 denotes the total or aggregated maximum I/O workload capability of tier 2, MAX-1 denotes the total or aggregated maximum I/O workload capability of tier 1, TOTAL WORKLOAD denotes the total activity or I/O workload summed for all SGs (as provided in the inputs). The foregoing among other items described herein in processing may be provided as inputs as also mentioned herein.

A first portion of processing steps may determine Z, an amount of I/O workload or activity for tier 3, the lowest performance tier. As described in more detail below, the first portion of processing steps (as will be discussed in connection with FIG. 14) may determine various values for Z, ranging from a minimum I/O workload, MIN-3, to MAX-3, where subsequent processing may be repeated for each such value for Z. Assume for the current iteration, Z=MN-3 denoting the minimum I/O workload to be placed on tier 3. MN-3 may be determined by examining a skew graph for all SGs as a single aggregate group (also referred to as the aggregated SG skew graph). Thus, for example, FIG. 11 may denote the capacity for the single aggregated group of all SGs. Assume that tier 1 and tier 2 are filled to their respective capacities where C1 denotes the total capacity of tier 1 and C2 denotes the total capacity of tier 2. Assume that such tiers 1 and 2 are filled with the busiest data portions or extents of all SGs having the highest I/O workloads. Thus, let:

S1=sum of the I/O workloads of the busiest extents with the largest I/O workloads placed on tier 1 and tier 2 up to the total capacities C1 and C2 of the tiers.

Figure 13:
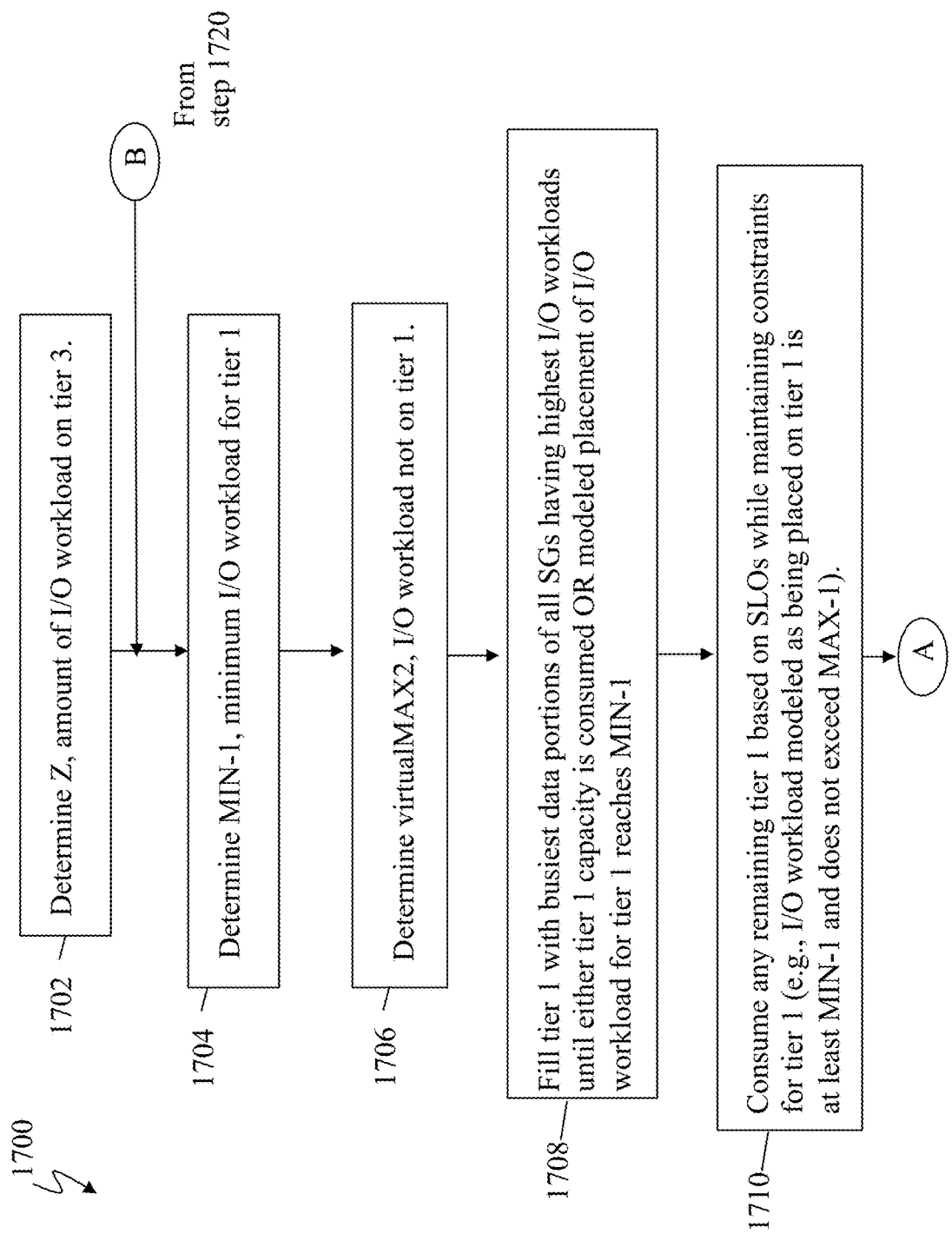
FIGS. 13, 13B and 14 are flowcharts of processing steps that may be performed in an embodiment in accordance with techniques herein.

As denoted by step 1702 and with reference now to FIG. 13, Z, the amount of I/O workload for tier 3 may be determined which, for the current iteration is MIN-3 which may be expressed as:

$$\text{MIN-3=TOTAL WORKLOAD}-S1 \qquad \text{EQUATION E1}$$

Processing initially places the least active extents having the lowest I/O workloads on tier 3 where MIN-3 may be denoted by A3 as in FIG. 3.

Next, described are a second portion of processing steps performed for the current value of Z=MIN-3 as determined in step 1702. In step 1704, processing may be performed to determine MIN-1, the minimum I/O workload tier 1 must take. MIN-1 may be calculated as:

$$\text{MIN-1=TOTAL WORKLOAD}-Z-\text{MAX-2} \qquad \text{EQUATION E2}$$

where
TOTAL WORKLOAD and MAX-2 are as provided in the inputs to the simulator; and Z is as determined in step 1702.

To further illustrate, consider an example where the TOTAL WORKLOAD for SGs is 100,000 IOPS, Z=10,000 (to be placed on tier 3) and MAX-2=25,000 IOPS. Then, MIN-1 as determined using EQUATION E-2 is 65,000 IOPS (e.g., 100,000-25,000-10,000) denoting that at least 65,000 IOPS must be placed on tier 1.

At step 1706, processing may be performed to determine virtualMAX2, the I/O workload not on tier 1 (e.g., I/O workload to be placed on tiers other than tier 1). Thus, virtualMAX2 may denote the remaining portion of TOTAL WORKLOAD to be placed on tiers 2 and 3 where tiers 2 and 3 may be considered in following processing steps as a combined I/O workload for a single virtual tier. VirtualMAX2 may be calculated as:

$$\text{VirtualMAX2}=Z+\text{MAX-2} \qquad \text{EQUATION E3}$$

wherein
Z is I/O workload on tier 3 (as determined in step 1702); and
MAX-2 is maximum workload on tier 2 as provided in the inputs.

In the current example, virtualMAX2=35,000 IOPS (e.g., for Z=10,000 IOPS added to MAX-2 which is 25,000 IOPS).

It should be noted that MIN-1 may be expressed another way and calculated as:

$$\text{MIN-1=TOTAL WORKLOAD}-\text{virtualMAX2} \qquad \text{EQUATION E3}$$

In step 1708, place the busiest portions from all SGs on tier 1 until either there is no remaining capacity on tier 1, or the I/O workload modeled as being placed on tier 1 has reached MIN-1. Thus, in step 1708, processing considers the health or SLE of tier 1 and lower tiers where processing determines a minimum workload for tier 1, MIN-1, so that other lower performance tiers will not be overloaded. Step 1708 may include, for example, ranking all extents of all SGs based on I/O workload directed to each SG where the ranking is from highest to lowest I/O workload and tier 1 capacity may be filled by selecting extents based on the ranking (e.g. the highest ranked extents).

At step 1710, processing is performed to model placement of extents from the SGs on any remaining tier 1 based on SLOs while maintaining constraints for tier 1 (e.g., I/O workload based on modeling the placement of the additional extents on tier 1 is at least MIN-1 and does not exceed MAX-1).

Step 1710 may include A) determining a ratio or distribution of I/O workload on tiers 2 and 3 (not already placed on tier 1) for each SG. The foregoing ratio or distribution may be estimated based on Z and MAX-2 and then used in the model as an estimate of the I/O workload distribution for each SG. Continuing with the example above, it was determined that MIN-1=65,000 IOPS is modeled as being placed on tier 1 so there is a total of 35,000 IOPS remaining in virtualMAX2 for distribution or placement on tiers 2 and 3 collectively. The question in step 1710 A) is how to distribute these 35,000 IOPS on tiers 2 and 3 for modeling or estimating a modeled RT for each SG. In at least one embodiment, the ratio of workload distribute overall for tier 2 and tier 3 may be based on Z (for tier 3) and MAX-2 (for tier 2) and use this ratio as an estimate of how I/O workload will be distributed for each SG in tiers 2 and 3. For example, determine a ratio for tier 2 with respect to the total remaining I/O workload as denoted by virtualMAX2 as follows:

ratio tier 2=MAX-2/VirtualMAX2=25,000 IOPS/35,000 IOPS=5/7   EQUATION E4

Also, determine a ratio for tier 3 with respect to the total remaining I/O workload as denoted by virtualMAX2 as follows:

ratio tier 3=Z/VirtualMAX2=10,000 IOPS/35,000 IOPS=2/7   EQUATION E5

Step 1710 may also include a next substep B) to estimate the expected RT for each SG based on the foregoing ratios for tier 2 and tier 3 (as determined using EQUATION E4 and E5) and also based on the data portions or extents of each SG placed by modeling on tier 1 (as in step 1708). Thus, the remaining I/O workload of virtualMAX 2 (for remaining extents of each SG not placed on tier 1) are modeled as being distributed on tier 2 based on the 5/7 ratio and tier 3 based on the 2/7 ratio.

One way in which an embodiment may calculate an expected RT for each SG considers tiers 2 and 3 as a combined single "virtual tier". For example, SG 1 may have a total I/O workload of N IOPS (e.g., denoted as input TOTAL WORKLOAD if there is only a single SG, SG1) where X IOPS are currently modeled as placed on tier 1 (e.g., MIN-1=65,000 IOPS) with remaining N−X IOPS (e.g., virtualMAX2=35,000) to be distributed among tiers 2 and 3 based on the above-mentioned ratio such as with 5/7 to tier 2 and 2/7 to tier 3. Based on this, the average RT for SG1 may be calculated as in EQUATION E6 below:

$SG1\ RT=[(X\ IOPS\ to\ tier\ 1*tier\ 1\ RT)+((N-X)\ IOPS\ to\ tiers\ 2\ and\ 3)*5/7*tier\ 2\ RT)+((N-X)\ IOPS\ to\ tiers\ 2\ and\ 3)*2/7*tier\ 3\ RT)]/N\ IOPS$ where the RT for each of tiers 1-3 may be the average predicted per tier response time based on the modeled distributed workload for each of the tiers 1-3.

Put another way, the average RT for SG1 may be calculated as in EQUATION E7 below:

$SG1\ RT=[(MIN-1*tier\ 1\ RT)+(virtualMAX2*5/7*tier\ 2\ RT)+(virtualMAX2*2/7*tier\ 3\ RT)]/TOTAL\ WORKLOAD$ where the RT for each of tiers 1-3 may be the average predicted per tier response time based on the modeled distributed workload for each of the tiers 1-3.

As expressed yet another way, the average RT (ave RT) with respect to a specified logical address space spanning the entire SG (entire collective or aggregated logical address space spanning one or more logical devices of the SG) may be expressed as in EQUATION C1 below:

$$\text{ave } RT \text{ (address space of } SG) = \frac{\sum_{i=1}^{n} \#IOs \text{ directed to Tier } i * \text{ave } RT \text{ per } IO \text{ for Tier } i}{\text{total } IOs \text{ directed to address space of } SG}$$

where
"address space of SG" denotes the logical address space for which the ave RT is being determined which is for the entire SG (e.g., all LUNs in the SG);

"i" ranges from 1 to n, denoting which of the various "n" tiers upon which data of the SG is stored;

"#IOs directed to Tier i" denotes the I/O workload (e.g. number of I/Os) directed to a data portion in the SG address space where the data portion is currently stored on SPi (tier i);

"ave RT per I/O for Tier i" denotes the average RT for each I/O directed to a data portion stored on tier i. This may be the average predicted per tier response time based on the modeled distributed workload for tier i; and "total I/Os directed to address space of SG" denotes the total sum or number of I/Os directed to the address space denoting the entire SG or all LUNs of the SG.

Thus any of the foregoing EQUATIONS E6, E7 and C1 may be used to determine an average modeled RT for each SG in step 1710 B).

It should be noted that the predicted per tier RT for each of tiers 1-3 as in this example may be determined based on hypothetically distributing workloads where the busiest extents (having highest workloads) of all SGs as selected in step 1708 are modeled as placed on the highest performance storage tier 1 and with the remaining workload (and associated capacity) hypothetically distributed among tiers 2 and 3 using the above-mentioned ratios (e.g., EQUATIONS E4 and E5, with again the busiest extents placed on the higher/est performing tier 2 rather than tier 3 based on the activity/workload ranking, from highest to lowest). An input to the model as described elsewhere herein (e.g., FIG. 9) may also include configuration information such as regarding the PDs of the data storage system being modeled. For example, the configuration information may describe, for each tier, the number of PDs, how the PDs are configured into one or more pools for each tier, information regarding RAID group configurations (e.g., number of PDs configured into a particular RAID group configuration) for PDs of each tier, and the like. The modeled per tier workload may be virtually distributed or modeled as distributed among the various pools, RAID groups, and the like, of each of the tiers. Performance models such as may be represented by the performance curves of FIG. 10 may be determined beforehand for the particular PDs, RAID configurations, and the like, and used to then model resulting performance (e.g., average RT) of the virtually distributed or modeled tier workloads. For example, with reference to FIG. 10, a performance curve may be used to model the resulting average RT (on the Y axis) for a virtually distributed or modeled I/O workload (on the X axis) for a particular tier. For example, the performance curve may denote the RT for each I/O directed to a particular PD included in a particular RAID configuration (e.g., performance curves may vary with, for example, drive type and technology (e.g., 10K RPM rotating disk drive vs 15K RPM rotating disk drive vs. flash), particular RAID configuration (e.g. RAID-1, RAID-5, or RAID-6), I/O workload read/write mixture (ratio or percentage of reads to writes), and the like. The virtually distributed total I/O workload for a tier may be looked up, such as based on the X coordinate of the performance curve used as the model, to determine a corresponding modeled or predicted RT for such a workload directed to the tier.

Additionally, since modeling models placement of the busiest extents of all SGs on the highest performance tiers, it is known which extents and associated workloads of each SG are modeled as being placed on each tier. Thus, for example with reference to FIG. 11 for each SG, the skew graph for each individual SG may be used to determine the workload A1 from each SG on tier 1, and the remaining workload from each tier on the remaining one or more tiers. An input to the model may be the skew graph for each SG with vertical lines drawn from points Q1 and Q2 denoting the capacity of the SG placed on each of the tiers. Each of the activity or workload portions A1-A3, respectively, for tiers 1-3 may be calculated as a percentage with respect to the SG's total I/O workload where the percentage may be determined based on the area of each of A1-A3 under the curve (where the sum of A1+A2+A3 denotes 100% of the SG's workload).

As an alternative to the foregoing for determining what portion of each SG's workload is on each tier (e.g., for a total workload on a tier, how much belongs to each SG), consider the following that may be performed in an embodiment in accordance with techniques. An embodiment may include in inputs, for each SG, a list of sorted (from highest to lowest) I/O workloads for each of the extents in the SG. For each tier, the minimum I/O workload may be determined with respect to all extents from all SGs virtually placed or modeled as being placed in the tier. For example, of all extents of all SGs placed on tier 1, the minimum I/O workload may be determined and may denote a threshold I/O workload for those extents placed virtually on tier 1. For each SG, the sorted list of I/O workloads for the SGs extents may be examined to determine those extents having an I/O workload equal to or greater than the threshold thereby denoting those extents and associated workload of the SG placed on tier 1. Similar processing may be performed for the other SGs and also for the other tiers.

In a next substep C) of step 1710, processing may be performed to select for modeled placement on tier 1 extents and associated I/O workloads of SGs currently not meeting their SLOs. Substep 1710 C) may include determining one or more SGs not meeting their SLO (e.g., modeled RT for SG>SLO for SG). Such an SG not meeting its SLO (e.g., exceeding their SLO and thus not meeting specified level of SLO performance) may have more of its workload placed on tier 1 rather than on tier 2 or 3 as now modeled by average SG RT determined in step 1710 B). Step 1710 C) may include selecting an SG not meeting its SLO and selecting one or more extents of the SG for placement on tier 1 rather than any other of tiers 2 and 3. After moving the selected extents of the 1 SG, processing of substeps 1710 A), 1710 B) and 1710 C) may be again repeated for remaining SGs not meeting their associated SLOs. Thus, in one embodiment, substeps 1710 A), 1710 B) and 1710 C) may be repeated until any of the following occur: either all SLOs of all SGs are met OR tier 1 has no remaining capacity OR tier 1's modeled I/O workload for extents placed thereon has reached its specified maximum, MAX-1.

It should be noted that an embodiment may select a particular SG not meeting its SLO from all SGs not meeting their respective SLOs based on any suitable one or more selection criteria. Similarly, an embodiment may select any one or more extents for modeled movement on tier 1 rather than tier 2 or 3 from such a selected particular SG not meeting its SLO based on any suitable one or more selection criteria. The foregoing selection and modeled placement of extents on tier 1 for modeling may be performed subject to tier 1 constraints whereby tier 1 has remaining capacity and tier 1's current modeled I/O workload does not exceed MAX-1.

For example, SGs not meeting their SLOs may be selected as tier 1 receivers in order to have an SG's SLO achieved. Put another way, an SLO may be selected as a tier 1 receiver (whereby extent(s) from the SG are modeled as being placed on tier 1 rather than another tier) in order to maximize the number of SGs achieving their respective SLOs, or coming as close to achieving such SLOs. As a variation, an embodiment, may prioritize SGs based on SLOs not being met where those SGs having a lower SLO not being met are selected as tier 1 receivers prior to other SGs having a higher SLO. In this manner, those SGs/applications having a lower SLO may be characterized as having a higher performance and priority than other SGs/applications with a higher SLO denoting lower target performance. Still further, an embodiment may consider how close the modeled average RT for the SG (as determined in step 1710 B)) is to its SLO. Thus, SGs may be ranked based on a difference between the SLO and the modeled average RT for the SG and rank the SGs not meeting their SLOs in terms of increasing difference (from highest to lowest). As a variation, such ranking may be normalized where each difference is further divided by the SLO. As a further variation, an embodiment may select or rank SGs not meeting their respective SLOs based on multiple such factors some of which are described above. Such factors when combined may be weighted.

More generally, an embodiment may determine a score or other metric for each extent where such scores may be used to rank extents of SGs not meeting their respective SLOs. The particular extent(s) of an SG moved to tier 1 may be based on such a ranking of scores. The score for each extent may be based on one or more selection criteria examples of which are noted above. A score used in an embodiment may combine multiple such criteria in a weighted manner or equation. For example, in one embodiment, the score for an extent belonging to an SG may include a first factor or term based on the difference or amount by which the SG including the extent is missing its SLO. The score may also include a second factor or term based on a ratio of the I/O workload of the SG including the extent with respect to the total I/O workload of all SGs (e.g., TOTAL WORKLOAD). The score may also include a third term or factor based on a predicted activity or workload of the extent. Each of the foregoing first and second terms may have an associated weight that may be varied whereby the score may be based on combining the foregoing 3 terms.

At step 1712, one or more swaps may be performed each swapping extents between a tier 1 donor, SGj, and tier 1 receiver, SGi. Step 1712 may include determining a first set of one or more SGs are not meeting their respective SLOs (e.g., average RT for SG>SLO) whereby such SGs need to have more of their respective workloads on tier 1. This may be performed in a manner similar to as described above in connection with substep 1710 C). Step 1712 may include determining a second set of one or more SGs meeting their respective SLO (e.g., average RT for SG≤SLO) and also having an extent currently placed on tier 1 by the modeling. From the first set of SGs not meeting their respective SLOs, a tier 1 receiver SGi is selected that will receive tier 1 storage from a selected one of the SGs, SGj, of the second set meeting their respective SLOs. Thus, SG j (tier 1 donor) will donate its tier 1 storage to SG i whereby a first data portion of SGj on tier 1 will be swapped with a second data portion of SGj not currently placed on tier 1 (currently placed on tier 2 or 3). The foregoing swap between the first data portion from SGj (tier 1 donor) and the second data portion from SGi (tier 1 receiver) may be performed in accordance with ensuring the following constraints are also met:

1. SG j must still meet its SLO; and
2. tier 1's modeled I/O workload, after swapping the selected extents, is still at least MIN-1 and does not exceed MAX-1 (e.g., tier 1 still healthy and other tiers are not overloaded by ensuring tier 1 still has MIN-1 workload). Thus candidates for the first and second data portions may be selected for swapping in step 1712 based on the foregoing constraints being met.

In a manner similar to as described in step 1710 for selecting which extents to move to tier 1 and which remain on other tiers, an embodiment may use any suitable one or more selection criteria to select a tier 1 donor, SGj, and to select 1 tier 1 receiver, SGi. An SG selected as a tier 1 receiver, SGi, may be based one or more selection criteria such as used above in connection with step 1710 to select tier 1 receivers. In one embodiment, an overall SLO Attainment Value may be determined for all SGs and a swap may be performed selecting SGi and SGj which result in an improved SLO Attainment value. For each SG not meeting its SLO, a penalty value may be calculated. For each SG meeting its SLO (and possibly having an average RT which is less than or exceeds specified SLO performance), an advantage value may be calculated. The SLO Attainment Value may be based on the sum of all advantage values for all SGs minus all penalty values. In one embodiment, the penalty value for an SGk not meeting its SLO may be calculated as in EQUATION E8 below:

Penalty value $SGk$=(average $RT\ SGk$–$SLO$ of $SGk$)/ $SLO$ of $SGk$.

An advantage value for an SGk meeting its SLO may be calculated as in EQUATION E9 below:

Advantage value $SGk$=SQRT[$SLO$ of $SGk$–average $RT\ SGk$)/$SLO\ SGk$]

where SQRT denotes the square root of the quantity specified (e.g., between brackets "[ ]").

The SLO Attainment value may be calculated as represented in EQUATION E10 below:

$SLO$ Attainment value=SUM of Advantage values of all $SGs$–SUM of penalty values of all $SGs$ where SUM denotes the mathematical SUM from adding the specified Advantage values in the first term and adding the specified penalty values of the second term and taking the difference between the first and second terms.

From step 1712, control proceeds to step 714 to repeat processing of steps 1704, 1706, 1708, 1710 and 1712 using tier 2 as the target "tier" being filled rather than tier 1. Such repeat processing uses tier 2 as the target tier to decide which remaining extents (that have not been placed on tier 1) should be placed by the modeling on tier 2 rather than tier 3. Step 1714 may include repeating step 1704 with respect to tier 2 where MIN-2 is determined as expressed in EQUATION E11:

MIN-2=TOTAL WORKLOAD–I/O WORKLOAD PLACED on TIER 1–Z where
TOTAL WORKLOAD is as provided in the inputs to the simulator;
I/O WORKLOAD PLACED on TIER 1 is the total I/O workload modeled as being placed on tier 1 as a result of processing performed at the end of steps 1704, 1706, 1708, 1710 and 1712 using tier 1 as the target; and
Z is the I/O WORKLOAD placed on tier 3 (in step 1702).
Step 1714 may include repeating step 1706 to determine the I/O workload not in tiers 1 and 2 which is Z.

Step 1714 may include repeating step 1708 with respect to filling tier 2 rather than tier 2 where to processing is performed to model placement of extents and associated workload in tier 2 until either the current total I/O workload of the modeled tier 2 reaches MIN-2 or there is otherwise no remaining tier 2 capacity. Again, such processing selects for placement on tier 2 those busiest unplaced data portions (not currently placed on tier 1). Step 1710 may be repeated with respect to tier 2 to consume any remaining tier 2 capacity based on SLOs while maintaining tier 2 constraints. The tier 2 constraints may include ensuring that any modeled data movement results in the current total I/O workload for extents modeled as being placed in tier 2 to be equal to or greater than MIN-2 and to also not exceed MAX-2. Step 1712 may be repeated to determine one or more swaps performed between modeled placement of extents. Each swap includes swapping an extent of a tier 2 donor, SGj, (e.g., the extent currently placed via modeling on tier 2) with another extent of a tier 2 receiver, SGi, (e.g., where the another extent is currently placed via modeling on tier 3). Thus, step 1712 is repeated with respect to tiers 2 and 3 rather than with respect to tier 1 and extents placed collectively on any of tiers 2 and 3 via modeling.

Generally, the foregoing processing may be repeated for any number of two or more tiers although such processing has been described in the example for purposes of illustration with respect to 3 tiers.

At the end of processing of step 1714, the modeling tool or simulator has modeled placement of extents of all SGs on the 3 storage tiers. Thus, at step 1716, one or more outputs may be generated by the tool. The outputs may include the amount or capacity of each tier allocated via simulation for storing data of each SG is known and may be generated as an output by the tool. Also, processing performed has modeled placement or distribution of the TOTAL WORKLOAD of all SGs and, thus, distribution of the total workload for each SG among the 3 storage tiers. As such, for each SG, a portion of the SG's I/O workload has been placed on each of the 3 storage tiers and a modeled average RT for each SG may be calculated, for example, using EQUATION C1 described elsewhere herein, and generated as an output.

In a similar manner, a modeled average RT may be determined with respect to all SGs denoting an overall performance for I/Os with respect to the data storage system as a result of the modeling and simulation of data placement performed. Additionally, at the end of step 1714, it is known how many SGs achieved or met their respective SLOs and, if an SG did not meet its SLO, what is the difference between the modeled RT for the SG and the SG's SLO. Thus, at the end of step 1714, one or more metrics may be used to assess the "goodness" or success of the particular configuration and modeled data placement in connection with meeting the goal of maintaining the health of the resources (e.g., not exceeding maximum workloads of the storage tiers/storage pools while also ensuring tier workloads are at a minimum needed to maintain a health stable system) while also attempting to meet the SLOs specified for the various SGs. For example, an embodiment may use a metric such as the SLO Attainment Value determined using EQUATION E10 to score or assess the modeled data placement based on the specified inputs provided to the tool. The foregoing overall modeled average RT with respect to all SGs and one or more metrics, such as the SLO Attainment Value, may be included in the outputs generated by the simulator or modeling tool.

As mentioned above, processing just described may be repeated a number of times using different values of Z. Thus, an embodiment in accordance with techniques herein may proceed to step 1718 to determine whether processing for all values of Z has been completed. If step 1718 evaluates to yes, control proceeds to step 7122 to select which data placement modeling alternative is best. In one embodiment, such selection may be based on one or more metrics used to assess the effectiveness, goodness, or level of satisfaction of the particular alternative in meeting both the goals of SLEs for the PDs of the storage tiers (e.g., storage resources) and also the goals of the SLOs for the SGs (e.g., consumers of the storage resources). For example, an embodiment may use the SLO Attainment Value or some other metric to select one of the alternatives each using a different value for Z where the SLO Attainment Value may denote a level of satisfaction of a particular alternative modeled in obtaining the SLOs for the SGs. Generally, the metric used may take into account any one or more of:

- the number of SGs meeting their respective SLOs (where the modeled average RT denotes a performance that is not less than the performance specified in the SLO);
- the number of SGs not meeting their respective SLOs (where the modeled average RT denotes a performance that is less than the performance specified in the SLO);
- for SGs not meeting their SLOs, the closeness or difference between the modeled average RT for the SG and the SG's SLO (e.g., such as denoted using the penalty value described elsewhere herein); and
- for SGs meeting their SLOs, the closeness or difference between the SG's SLO and the modeled average RT for the SG (e.g., such as denoted using the advantage value described elsewhere herein).

Additionally, the one or metrics used in step 1722 to select a best data placement modeling alternative (e.g., which Z value modeled had the best modeled or simulate data placement) may also include a metric denoting the overall performance for I/Os of the data storage system, such as the overall average modeled RT as determined with respect to all SGs.

If step 1718 evaluates to no, control proceeds to step 1720 to determine an updated value for Z and control proceeds to step 1704 to repeat processing using the revised Z value.

Figure 14:
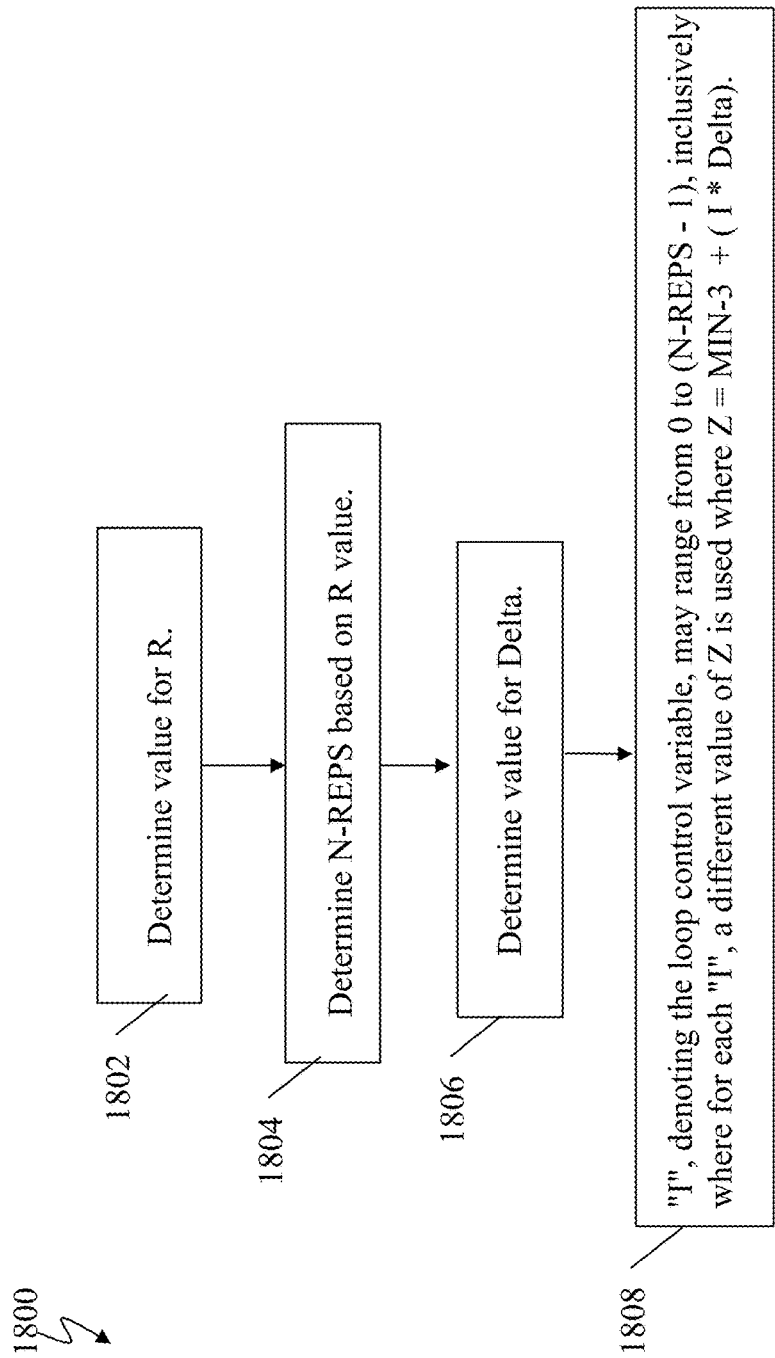

What will now be described with reference to FIG. 14 is how the number of Z values and also the value of the various Z values may be determined in an embodiment in accordance with techniques herein. As described above, Z may range in values from MIN-3 to MAX-3.

An embodiment may determine N-REPS denoting the number of alternative values of Z for which modeling based on R, denoting a range or span between MIN-3 and MAX-3 where R may be calculated in step 1802 as follows:

$$R = (MAX\text{-}3 - MIN\text{-}3)/MAX/3 \qquad \text{EQUATION E12}$$

In step 1804, N-REPS may be assigned a value from 1 to 5, inclusively, depending on the particular R value calculated in step 1802 as follows:

| R values | N-REPS |
|---|---|
| R < 0.04 | 1 |
| 0.4 ≤ R < 0.10 | 2 |
| 0.1 ≤ R < 0.20 | 3 |
| 0.2 ≤ R < 0.30 | 4 |
| R >= 0.30 | 5 |

In step 1806, a value for Delta may be determined. Delta may be assigned a value of 0 if N-REPS=1. Otherwise, if N-REPS is a value other than 1, Delta may be calculated as follows:

$$\text{Delta} = (MAX\text{-}3 - MIN\text{-}3)/(N\text{-}REPS\text{-}1) \qquad \text{EQUATION E13}$$

Figure 13B:
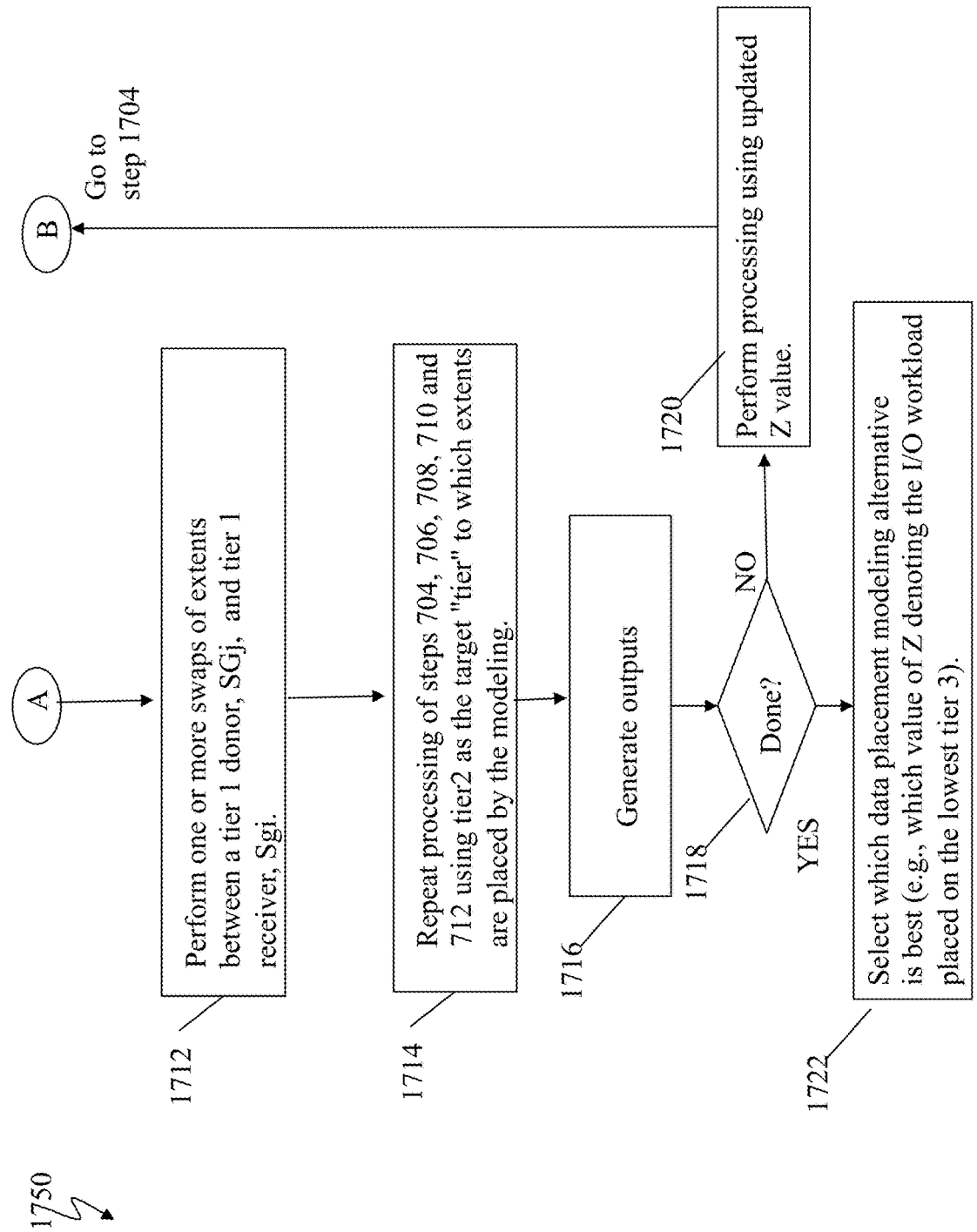

In step 1808, "I" may be used to denote a loop control variable controlling the number of processing iterations performed where each of the iterations each uses a different Z value and each produces another data placement modeling alternative. "I" may range from 0 to (N-REPS−1), inclusively, where for each "I", a different value of Z is used where Z=MIN-3+(I*Delta). Thus, I may denote an loop control variable ranging from 0 to (N-REPS−1), inclusively, where when I=N-REPS, no further Z values are considered and used. With respect to FIGS. 13 and 13B, I may be initially assigned a value=0 such as part of step 1702 processing. After step 1716 is performed, I may be increments by one (1) and step 1718 may determine whether I=N-REPS. If so, step 1718 may evaluate to yes. Otherwise, if step 7118 determines that I is not equal to N-REPS, control may proceed to step 1720. Step 1720 may determine an updated value for Z=MIN-3+(I*Delta). Additionally, in one embodiment, the processing just described with respect to step 1802, 1804 and 1806 may be performed, for example, prior to step 1702 processing of FIG. 13.

It should be noted that an embodiment in accordance with techniques herein may evaluate different alternatives for data placement using various values for Z, the amount of workload placed on the lowest performance tier, such as tier 3, in order to facilitate SLO attainment. Thus, an embodiment in accordance with techniques herein may not always want to place the busiest data on the highest/higher performance tiers (other than tier 3). For example, an embodiment may want to place a less active extent from an SG on tier 1 in order to help the SG achieve its SLO. It may be beneficial to place more workload on tier 3 than MIN-3 to allow placing a lesser workload on higher tiers and achieve SLOs. Thus, an embodiment in accordance with techniques herein may perform processing, such as with a swap performed in step 1712, to place an extent having relatively low I/O workload on the highest/higher performance tier than another extent having a higher I/O workload in order to achieve an SLO.

Processing may be performed repeatedly as just described using multiple values for Z denoting the I/O workload placed on tier 3. Such processing may evaluate data placement modeling results for the multiple values of Z to see which particular Z value results in achieving the health of the system and storage tiers (e.g., with workload for each tier ranging from a minimum specified workload to a maximum workload denoting the maximum capability of the tier) and also resulting in the best SLO attainment (as may be measured using any one or more metrics or criteria some of which are described herein). Processing as described herein always starts by placing the least active data portions on tier 3. Each alternative placed more load on tier 3 and provides more flexibility in terms of placement of various extents in higher performance tiers 1 and 2 to achieve SLOs.

It should be noted that the SLEs provided as an input to the modeling tool or simulator may be used by the tool as boundary conditions of the modeling. Consistent with description herein, SLEs may be specified for different tiers denoting a desired level of performance for each such tier. For example, where SLEs denote average RTs, 3 SLEs may be specified as follows: 2 ms. for tier 1/flash; 6 ms for tier 2/15K RPM rotating disk drives and 12 ms for tier 3/7.2K RPM rotating disk drives. The SLEs may be used in determining the maximum I/O workload each tier may handle such as using modeled performance curves such as illustrated in FIG. 10. For example, using the performance curve for tier 2/15K RPM the RT of 2 ms. as specified for the tier 2 SLE may be located on the Y axis of the performance curve 404 to determine the corresponding X coordinate on the curve denoting the maximum I/O workload for tier 2. More generally, the RT denoted by the SLE may be used with the performance curve modeling PDs of tier 2 to determine a corresponding I/O workload for the SLE, where the corresponding I/O workload may denote the maximum I/O workload for the tier 2. For example, MAX-1, MAX-2 and MAX-3 are described elsewhere herein for use with performing processing described herein. The SLE for tier 1 may be used to determine MAX-1 for tier 1, the SLE for tier 2 may be used to determine MAX-2 for tier 2, and the SLE for tier 3 may be used to determine MAX-3 for tier 3 (and also values for X ranging from MIN-3 to MAX-3). Generally, techniques herein perform processing given the foregoing MAX-1, MAX-2 and MAX-3 values where, based on such maximum workloads for the tiers, processing may be performed to determine "optimal" workloads for the tiers within the foregoing maximum workloads. In an embodiment in accordance with techniques herein, it should be noted that processing may be unable to determine a virtual or modeled workload distribution of the SG workloads among the tiers where such tiers have modeled workloads (based on the distribution) less than the specified tier maximum workloads. In this case, processing may determine that the data storage system is "overloaded" meaning system does not have sufficient resources (e.g., PDs as specified in the input data storage system configuration) to meet the SGs demands/workloads thereby denoting an unstable system performance state. In this case, an action may be taken, for example, to increase the amount of PDs, or more generally, increase data storage system resources available to meet the SG workload demands.

It should be noted that rather than provide a skew graph for each SG as an input to the tool or simulator, such information may be embodied in a different form provided as an input for use with processing described herein. For example, an embodiment may provide as an input for each SG a list of extents sorted based on the I/O workloads directed to each extent of the SG. The list may be sorted from highest to lowest I/O workload. An embodiment may combine such sorted lists into an aggregated list including all extents from all SGs under consideration to thereby form a single aggregated sorted list of extents of all SGs based on I/O workload. Such an aggregated sorted list of extents for all SGs may be used, for example, by step 1708. Additionally, the particular extents from each SG placed on each of the tiers may be tracked and thus used in determining the amount of each SG's workload placed on each tier such as in connection with determining a RT for each SG.

More generally, any input or item used in connection with techniques herein may take any suitable form or structure for use with the particular embodiment. As another example, the performance curves such as illustrated in FIG. 10 may be in any suitable form, such as a table, list of points, and the like, and may generally include any number of points which may be fitted to a curve using known curve fitting techniques, interpolation, and the like.

The techniques herein may be performed by executing code which is stored on any one or more different forms of computer-readable media. Computer-readable media may include different forms of volatile (e.g., RAM) and non-volatile (e.g., ROM, flash memory, magnetic or optical disks, or tape) storage which may be removable or non-removable.

While the invention has been disclosed in connection with preferred embodiments shown and described in detail, their modifications and improvements thereon will become readily apparent to those skilled in the art. Accordingly, the spirit and scope of the present invention should be limited only by the following claims.

What is claimed is:

1. A method of modeling processing performed in a data storage system comprising:
  receiving, using a processor, inputs including a plurality of workloads each denoting a workload for a different one of a plurality of storage groups, a plurality of service level objectives each denoting a target level of performance for a different one of the plurality of storage groups, a plurality of capacities each denoting a storage capacity of a different one of a plurality of storage tiers, and a plurality of maximum workloads each denoting a maximum workload capability of a different one of the plurality of storage tiers;
  modeling, using the inputs and a processor, placement of data of the plurality of storage groups on the plurality of storage tiers, wherein said modeling includes:
    determining a first minimum workload for a lowest performing one of the plurality of storage tiers as a difference between a total workload and a first sum, wherein the total workload is an aggregate of the plurality of workloads for the plurality of storage groups, wherein the first sum denotes a sum of I/O workloads of busiest data portions of the plurality of storage groups, wherein the busiest data portions have highest workloads of all data portions of the plurality of storage groups and where the busiest data portions have an associated total capacity equal to a total sum capacity of each of the plurality of storage tiers other than the lowest performing storage tier, wherein during said modeling, the lowest performing storage tier is allowed to have a modeled workload varying from the first minimum workload to an associated one of the plurality of maximum workloads of the lowest performing storage tier;
    for a first modeling alternative, modeling placement of first data in a first of the plurality of storage tiers until modeled workload for the first storage tier reaches a first minimum workload denoting a minimum I/O workload to be placed on the first storage tier, wherein the first storage tier is a highest performance tier of the plurality of storage tiers, wherein each of the plurality of storage groups includes a plurality of data portions, each data portion being an extent, wherein modeling placement of the first data includes ranking the plurality of data portions of the plurality of storage groups based on I/O workload and wherein the first minimum workload is reached by selecting data portions of the plurality of data portions of the plurality of storage groups based on the ranking of the plurality of data portions; and
    subsequent to said modeling placement of the first data for the first modeling alternative, modeling placement of second data on the first storage tier in the first modeling alternative, wherein the second data modeled for placement on the highest performance tier is from one or more storage groups selected from a portion of the plurality of storage groups each not meeting a corresponding one of the plurality of service level objectives, wherein the one or more storage groups are selected from the portion in accordance with a ranking of storage groups, wherein said ranking of storage groups ranks each storage group of the portion based on a difference between a modeled performance of said each storage group and a target level of performance of said each storage group denoted by the corresponding one of the plurality of service level objectives for said each storage group; and generating, using a processor, one or more outputs based on the modeling, the one or more outputs including an amount of each of the plurality of storage tiers allocated by said modeling to each of the plurality of storage groups.

2. The method of claim 1, wherein said modeling placement of the first data and said modeling placement of the second data each model data placement in accordance with criteria including maintaining I/O minimum workloads for the plurality of storage tiers and attempting to meet the plurality of service level objectives for the plurality of storage tiers.

3. The method of claim 1, wherein the plurality of storage tiers includes at least two storage tiers, each of the at least two storage tiers including physical storage devices having a set of performance characteristics that differs from performance characteristics of other physical storage devices of other ones of the at least two storage tiers.

4. The method of claim 1, wherein the first data includes those data portions of the plurality of storage groups having a highest workload of all data portions of the plurality of storage groups.

5. The method of claim 4, wherein, after said modeling placement of the first data, the first storage tier has remaining capacity, and said modeling placement of the second data includes modeling placement of one or more additional data portions on the first storage tier while maintaining one or more constraints including a modeled I/O workload for data placed on the first storage tier being at least the first minimum workload and also not exceeding a first of the plurality of maximum workloads associated with the first storage tier, wherein each of the plurality of maximum workloads is a maximum I/O workload for a different one of the plurality of storage tiers.

6. The method of claim 5, wherein the one or more additional data portions are selected for modeled placement in the first storage tier from one or more storage groups of the portion of the plurality of storage groups based on the ranking of storage groups.

7. The method of claim 5, wherein said modeling includes modeling a swap of a first data portion currently placed by said modeling on the first storage tier with a second data portion currently placed by said modeling on a second of the plurality of storage tiers ranked lower in terms of performance than the first storage tier.

8. The method of claim 7, wherein the first data portion is included in a first of the plurality of storage groups meeting its associated one of the plurality of service level objectives and wherein the second data portion is included in a second of the plurality of storage groups not meeting its associated one of the plurality of service level objectives.

9. The method of claim 8, wherein said modeling further comprises:

determining whether swapping the first data portion with the second data portion would result in the first storage group no longer meeting its associated one of the plurality of service level objectives; and determining not to model a swap of the first data portion and the second data portion if it is determined that swapping the first data portion with the second data portion would result in the first storage group no longer meeting its associated one of the plurality of service level objectives.

10. The method of claim 9, wherein said modeling further comprises:

determining a first modeled workload for the first storage tier denoting a modeled workload of the first storage tier if the first and second data portions are swapped;

determining whether the first modeled workload exceeds the first of the plurality of maximum workloads associated with the first storage tier; and determining not to model a swap of the first data portion and the second data portion if it is determined that swapping the first data portion with the second data portion would result in the first modeled workload exceeding the first of the plurality of maximum workloads associated with the first storage tier.

11. The method of claim 4, further comprising modeling placement of data from the plurality of storage groups into a second of the plurality of storage tiers after modeling placement of data in the first storage tier.

12. The method of claim 1, wherein each of the plurality of workloads denotes a backend I/O workload for one of the plurality of storage groups, and each of the plurality of service level objectives denotes a response time.

13. The method of claim 1, wherein each of the plurality of storage groups includes one or more logical devices used by an application and wherein at least one of the logical devices in at least one of the plurality of storage groups is a virtually provisioned logical device.

14. The method of claim 1, wherein the one or more outputs includes a metric for each of the plurality of storage groups denoting a modeled performance for said each storage group based on an amount of each of the plurality of storage tiers allocated by said modeling to said each storage group.

15. A system comprising:
one or more processors; and
a memory comprising code stored thereon that, when executed, performs a method of modeling processing performed in a data storage system comprising:
receiving, using a processor, inputs including a plurality of workloads each denoting a workload for a different one of a plurality of storage groups, a plurality of service level objectives each denoting a target level of performance for a different one of the plurality of storage groups, a plurality of capacities each denoting a storage capacity of a different one of a plurality of storage tiers, and a plurality of maximum workloads each denoting a maximum workload capability of a different one of the plurality of storage tiers;

modeling, using the inputs and a processor, placement of data of the plurality of storage groups on the plurality of storage tiers, wherein said modeling includes:

determining a first minimum workload for a lowest performing one of the plurality of storage tiers as a difference between a total workload and a first sum, wherein the total workload is an aggregate of the plurality of workloads for the plurality of storage groups, wherein the first sum denotes a sum of I/O workloads of busiest data portions of the plurality of storage groups, wherein the busiest data portions have highest workloads of all data portions of the plurality of storage groups and where the busiest data portions have an associated total capacity equal to a total sum capacity of each of the plurality of storage tiers other than the lowest performing storage tier, wherein during said modeling, the lowest performing storage tier is allowed to have a modeled workload varying from the first minimum workload to an associated one of the plurality of maximum workloads of the lowest performing storage tier;

for a first modeling alternative, modeling placement of first data in a first of the plurality of storage tiers until modeled workload for the first storage tier reaches a first minimum workload denoting a minimum I/O workload to be placed on the first storage tier, wherein the first storage tier is a highest performance tier of the plurality of storage tiers, wherein each of the plurality of storage groups includes a plurality of data portions, each data portion being an extent, wherein modeling placement of the first data includes ranking the plurality of data portions of the plurality of storage groups based on I/O workload and wherein the first minimum workload is reached by selecting data portions of the plurality of data portions of the plurality of storage groups based on the ranking of the plurality of data portions; and subsequent to said modeling placement of the first data for the first modeling alternative, modeling placement of second data on the first storage tier in the first modeling alternative, wherein the second data modeled for placement on the highest performance tier is from one or more storage groups selected from a portion of the plurality of storage groups each not meeting a corresponding one of the plurality of service level objectives, wherein the one or more storage groups are selected from the portion in accordance with a ranking of storage groups, wherein said ranking of storage groups ranks each storage group of the portion based on a difference between a modeled performance of said each storage group and a target level of performance of said each storage group denoted by the corresponding one of the plurality of service level objectives for said each storage group; and generating, using a processor, one or more outputs based on the modeling, the one or more outputs including an amount of each of the plurality of storage tiers allocated by said modeling to each of the plurality of storage groups.

16. A non-transitory computer readable medium comprising code stored thereon that, when executed, performs a method of modeling processing performed in a data storage system comprising:

receiving, using a processor, inputs including a plurality of workloads each denoting a workload for a different one of a plurality of storage groups, a plurality of service level objectives each denoting a target level of performance for a different one of the plurality of storage groups, a plurality of capacities each denoting a storage capacity of a different one of a plurality of storage tiers, and a plurality of maximum workloads each denoting a maximum workload capability of a different one of the plurality of storage tiers;

modeling, using the inputs and a processor, placement of data of the plurality of storage groups on the plurality of storage tiers, wherein said modeling includes:

determining a first minimum workload for a lowest performing one of the plurality of storage tiers as a difference between a total workload and a first sum, wherein the total workload is an aggregate of the plurality of workloads for the plurality of storage groups, wherein the first sum denotes a sum of I/O workloads of busiest data portions of the plurality of storage groups, wherein the busiest data portions have highest workloads of all data portions of the plurality of storage groups and where the busiest data portions have an associated total capacity equal to a total sum capacity of each of the plurality of storage tiers other than the lowest performing storage tier, wherein during said modeling, the lowest performing storage tier is allowed to have a modeled workload varying from the first minimum workload to an associated one of the plurality of maximum workloads of the lowest performing storage tier;

for a first modeling alternative, modeling placement of first data in a first of the plurality of storage tiers until modeled workload for the first storage tier reaches a first minimum workload denoting a minimum I/O workload to be placed on the first storage tier, wherein the first storage tier is a highest performance tier of the plurality of storage tiers, wherein each of the plurality of storage groups includes a plurality of data portions, each data portion being an extent, wherein modeling placement of the first data includes ranking the plurality of data portions of the plurality of storage groups based on I/O workload and wherein the first minimum workload is reached by selecting data portions of the plurality of data portions of the plurality of storage groups based on the ranking of the plurality of data portions; and subsequent to said modeling placement of the first data for the first modeling alternative, modeling placement of second data on the first storage tier in the first modeling alternative, wherein the second data modeled for placement on the highest performance tier is from one or more storage groups selected from a portion of the plurality of storage groups each not meeting a corresponding one of the plurality of service level objectives, wherein the one or more storage groups are selected from the portion in accordance with a ranking of storage groups, wherein said ranking of storage groups ranks each storage group of the portion based on a difference between a modeled performance of said each storage group and a target level of performance of said each storage group denoted by the corresponding one of the plurality of service level objectives for said each storage group; and generating, using a processor, one or more outputs based on the modeling, the one or more outputs including an amount of each of the plurality of storage tiers allocated by said modeling to each of the plurality of storage groups.

17. The method of claim 1, further comprising:

determining, in accordance with said modeling and said inputs, that a current configuration of the data storage system including the plurality of capacities of the plurality of storage tiers and the plurality of maximum workloads for the plurality of storage tiers is overloaded with respect to the plurality of workloads for the plurality of storage groups, wherein said modeling is unable to determine a modeled distribution of the plurality of workloads of the plurality of storage groups among the plurality of storage tiers where the plurality of storage tiers have modeled workloads less than the plurality of maximum workloads allowable; and responsive to determining that the current configuration of the data storage system is overloaded, modifying the current configuration including increasing storage capacity by adding physical storage devices to one or more of the plurality of storage tiers.

18. The method of claim 1, further comprising:

evaluating a plurality of modeled alternatives using a plurality of values for a metric, wherein each of the plurality of modeled alternatives is associated with a different one of the plurality of values denoting a level of satisfaction of said each modeled alternative in achieving the plurality of service level objectives specified for the plurality of storage groups, wherein the different one of the plurality of values of the metric for said each modeled alternative denotes a difference between a first sum of advantage values and a second sum of penalty values, wherein the first sum of advantage values is for a first portion of the plurality of storage groups meeting a first portion of the plurality of service level objectives each denoting a target level of performance for a different storage group of the first portion, and wherein the second sum of penalty values is for a second portion of the plurality of storage groups not meeting a second portion of the plurality of service level objectives each denoting a target level of performance for a different storage group of the second portion; and determining, using the plurality of values for the metric, a first of the plurality of modeled alternatives as a best of the plurality of modeled alternatives, wherein the first modeled alternative has a maximum of the plurality of values for the metric.

19. The method of claim 18, wherein the plurality of modeled alternatives each uses a different value for a minimum I/O workload for a lowest performing one of the plurality of storage tiers.

20. The method of claim 1, wherein said portion includes at least two storage groups, and wherein each of the storage groups of the portion is associated with one of a plurality of differences denoting the difference between the modeled performance of said each storage group and the target level of performance of said each storage group denoted by the corresponding one of the plurality of service level objectives for said each storage group, and wherein said ranking of storage groups ranks the at least two storage groups of the portion, from highest to lowest priority, in accordance with increasing values of the plurality of differences and wherein the one or more storage groups selected are ranked higher in priority than any other storage group in the ranking of storage groups.

21. The method of claim 1, wherein said modeling includes modeling a plurality of modeling alternatives including the first modeling alternative, and wherein each of the plurality of modeling alternatives uses one of a first plurality of current modeled workloads for the lowest performing storage tier, wherein each of the first plurality of current modeled workloads is a different value included in a range between the first minimum workload and the associated one maximum workload of the lowest performing storage tier.

22. The method of claim 1, wherein said ranking of storage groups uses a plurality of normalized differences, wherein each of the plurality of normalized differences denotes a normalized difference for an associated storage group of the portion, wherein the normalized difference is determined by dividing a difference, between a modeled performance of said associated storage group and a target level of performance of said associated storage group denoted by an associated one of the plurality of service level objectives for said associated storage group, by the target level of performance of said associated storage group.

* * * * *